(12) United States Patent
White et al.

(10) Patent No.: US 6,213,704 B1
(45) Date of Patent: Apr. 10, 2001

(54) METHOD AND APPARATUS FOR SUBSTRATE TRANSFER AND PROCESSING

(75) Inventors: John M. White, Hayward; Wendell T. Blonigan, Union City; Robin L. Tiner, Santa Cruz; Shinichi Kurita, San Jose, all of CA (US)

(73) Assignee: Applied Komatsu Technology, Inc., Tokyo (JP)

( * ) Notice: Subject to any disclaimer, the term of this patent is extended or adjusted under 35 U.S.C. 154(b) by 0 days.

(21) Appl. No.: 09/082,428

(22) Filed: May 20, 1998

(51) Int. Cl.[7] .................................................. B65G 49/07
(52) U.S. Cl. .......................... 414/217; 414/805; 414/939
(58) Field of Search ................................. 414/154, 191, 414/217, 749.3, 805, 939

(56) References Cited

U.S. PATENT DOCUMENTS

| | | | |
|---|---|---|---|
| 3,850,105 | 11/1974 | Aronstein et al. ............... 104/1 R |
| 3,973,665 | * 8/1976 | Giammanco .................... 414/217 X |
| 3,976,330 | 8/1976 | Babinski et al. .................... 302/2 R |
| 4,047,624 | 9/1977 | Dorenbos . |
| 4,166,563 | 9/1979 | Peyraud et al. ........................ 228/47 |
| 4,649,830 | * 3/1987 | Tanaka ............................ 414/217 X |
| 4,682,927 | * 7/1987 | Southworth et al. ................ 414/217 |
| 4,749,465 | 6/1988 | Flint et al. ............................ 204/298 |
| 4,775,281 | 10/1988 | Prentakis ............................. 414/416 |
| 4,829,445 | 5/1989 | Burney ................................ 364/478 |
| 4,846,102 | 7/1989 | Ozias ................................... 118/730 |
| 4,857,689 | 8/1989 | Lee .................................... 219/10.71 |
| 4,870,923 | 10/1989 | Sugimoto ............................. 118/715 |
| 4,913,929 | 4/1990 | Moslehi et al. ....................... 427/39 |
| 4,951,601 | 8/1990 | Maydan et al. ...................... 118/719 |
| 4,985,722 | 1/1991 | Ushijima et al. .................... 354/319 |
| 4,989,543 | 2/1991 | Schmitt ............................... 118/723 |
| 5,001,327 | 3/1991 | Hirasawa et al. ................... 219/390 |

(List continued on next page.)

FOREIGN PATENT DOCUMENTS

| | | |
|---|---|---|
| 2114470 | 9/1972 | (DE) . |
| 3941110A1 | 6/1990 | (DE) . |
| 0 359 525 A2 | 3/1990 | (EP) . |
| 0 608 633 A2 | 8/1994 | (EP) . |

(List continued on next page.)

OTHER PUBLICATIONS

Budo et al, "Modular Vacuum System", IBM Technical Disclosure Bulletin, vol. 17, No. 8, Jan. 1975.*

*Primary Examiner*—James W. Keenan
(74) *Attorney, Agent, or Firm*—Fish & Richardson PC

(57) ABSTRACT

The present invention allows large glass substrates to be rapidly moved from one processing station to another. Such movement occurs such that drives in different chambers are synchronized to move the glass substrates on shuttles at appropriate times. In systems according to the invention, at least a first and second chamber are provided. Typically, the first chamber is a load lock and the second chamber is a processing chamber. A substrate transfer shuttle is used to move substrate along a guide path defined by, e.g., guide rollers. Drive mechanisms are employed for most chambers to drive the shuttle along associated portions of the path. A control system is provided which powers the drive mechanism for the first chamber to drive the substrate transfer shuttle from a first position toward a second position and through an intermediate position. At the intermediate position, the substrate transfer shuttle begins to engage and induce movement of the drive mechanism for the second chamber. The control system receives an input caused by the induced movement of the drive mechanism for the second chamber, this input indicative of the substrate transfer shuttle having moved a predetermined distance beyond the intermediate position. The input may then be used to synchronize movement of the substrate transfer shuttle from the first chamber to the second chamber. Such synchronization may include reducing power to the drive mechanism for the first chamber and/or powering the drive mechanism for the second chamber.

27 Claims, 17 Drawing Sheets

U.S. PATENT DOCUMENTS

| | | | | |
|---|---|---|---|---|
| 5,060,354 | | 10/1991 | Chizinsky | 29/25.02 |
| 5,086,729 | * | 2/1992 | Katagiri | 414/217 X |
| 5,110,249 | * | 5/1992 | Norman | 414/217 |
| 5,178,638 | | 1/1993 | Kaneko et al. | 29/25.01 |
| 5,187,115 | | 2/1993 | Coleman . | |
| 5,203,443 | | 4/1993 | Toriumi et al. | 198/341 |
| 5,227,708 | | 7/1993 | Lowrance | 318/640 |
| 5,252,807 | | 10/1993 | Chizinsky | 219/390 |
| 5,259,883 | | 11/1993 | Yamabe et al. | 118/725 |
| 5,275,709 | * | 1/1994 | Anderle et al. | 414/217 X |
| 5,288,379 | | 2/1994 | Namiki et al. | 204/192 |
| 5,292,393 | | 3/1994 | Maydan et al. | 156/345 |
| 5,352,294 | | 10/1994 | White et al. | 118/725 |
| 5,355,066 | | 10/1994 | Lowrance | 318/640 |
| 5,377,816 | | 1/1995 | Deligi et al. | 198/619 |
| 5,382,126 | * | 1/1995 | Hartig et al. | 414/217 |
| 5,417,537 | * | 5/1995 | Miller | 414/217 |
| 5,425,611 | * | 6/1995 | Hughes et al. | 414/217 |
| 5,447,409 | | 9/1995 | Grunes et al. | 414/744.6 |
| 5,469,035 | | 11/1995 | Lowrance | 318/568.22 |
| 5,470,784 | | 11/1995 | Coleman . | |
| 5,512,320 | | 4/1996 | Turner et al. | 427/255 |
| 5,535,306 | | 7/1996 | Stevens | 395/89 |
| 5,536,128 | | 7/1996 | Shimoyashiro et al. | 414/273 |
| 5,537,311 | | 7/1996 | Stevens | 364/167.01 |
| 5,607,009 | | 3/1997 | Turner et al. . | |
| 5,611,865 | | 3/1997 | White et al. | 118/725 |
| 5,658,114 | * | 8/1997 | Mahler | 414/939 X |
| 5,674,786 | | 10/1997 | Turner et al. . | |
| 5,701,627 | | 12/1997 | Matsumura et al. | 18/88.2 |
| 5,846,328 | * | 12/1998 | Aruga et al. | 414/939 X |
| 5,881,649 | | 3/1999 | Hasegawa et al. | 104/167 |
| 5,976,199 | * | 11/1999 | Wu et al. | 414/939 X |

FOREIGN PATENT DOCUMENTS

| | | | | |
|---|---|---|---|---|
| 0 684 630 A2 | | 11/1994 | (EP) . | |
| 0 756 316 A1 | | 1/1997 | (EP) . | |
| 2171119 | * | 8/1986 | (GB) | 414/217 |
| 2284 105A | | 5/1995 | (GB) . | |
| 59-53320 | | 3/1984 | (JP) . | |
| 1117278 | * | 6/1986 | (JP) | 414/217 |
| 63-141342 | | 6/1988 | (JP) . | |
| 03-136345 | | 6/1991 | (JP) . | |
| 4-164718 | | 6/1992 | (JP) . | |
| 8-274142 | | 10/1996 | (JP) . | |
| WO 94/00868 | | 1/1994 | (WO) . | |
| WO 98/02911 | | 1/1998 | (WO) . | |

* cited by examiner

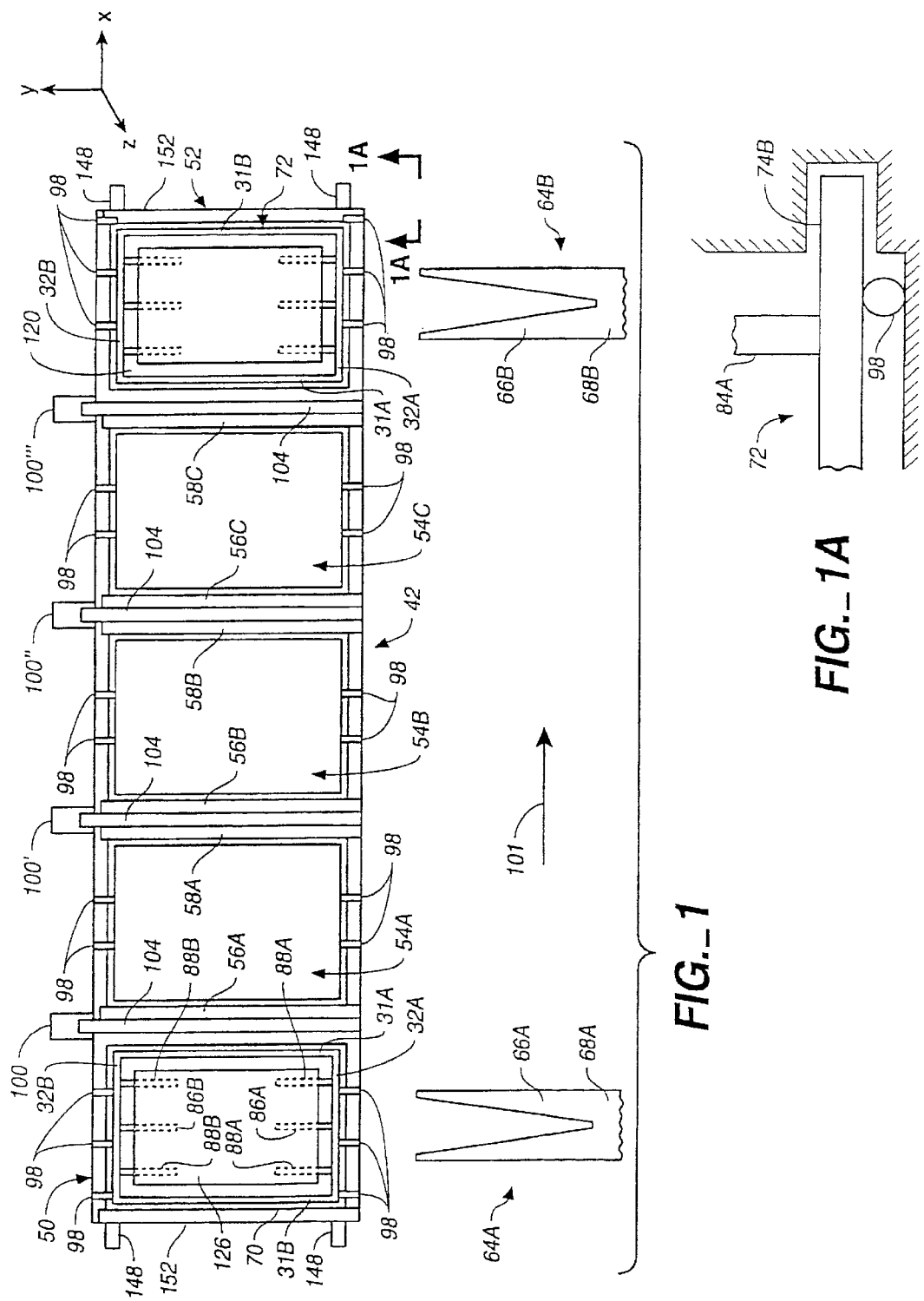

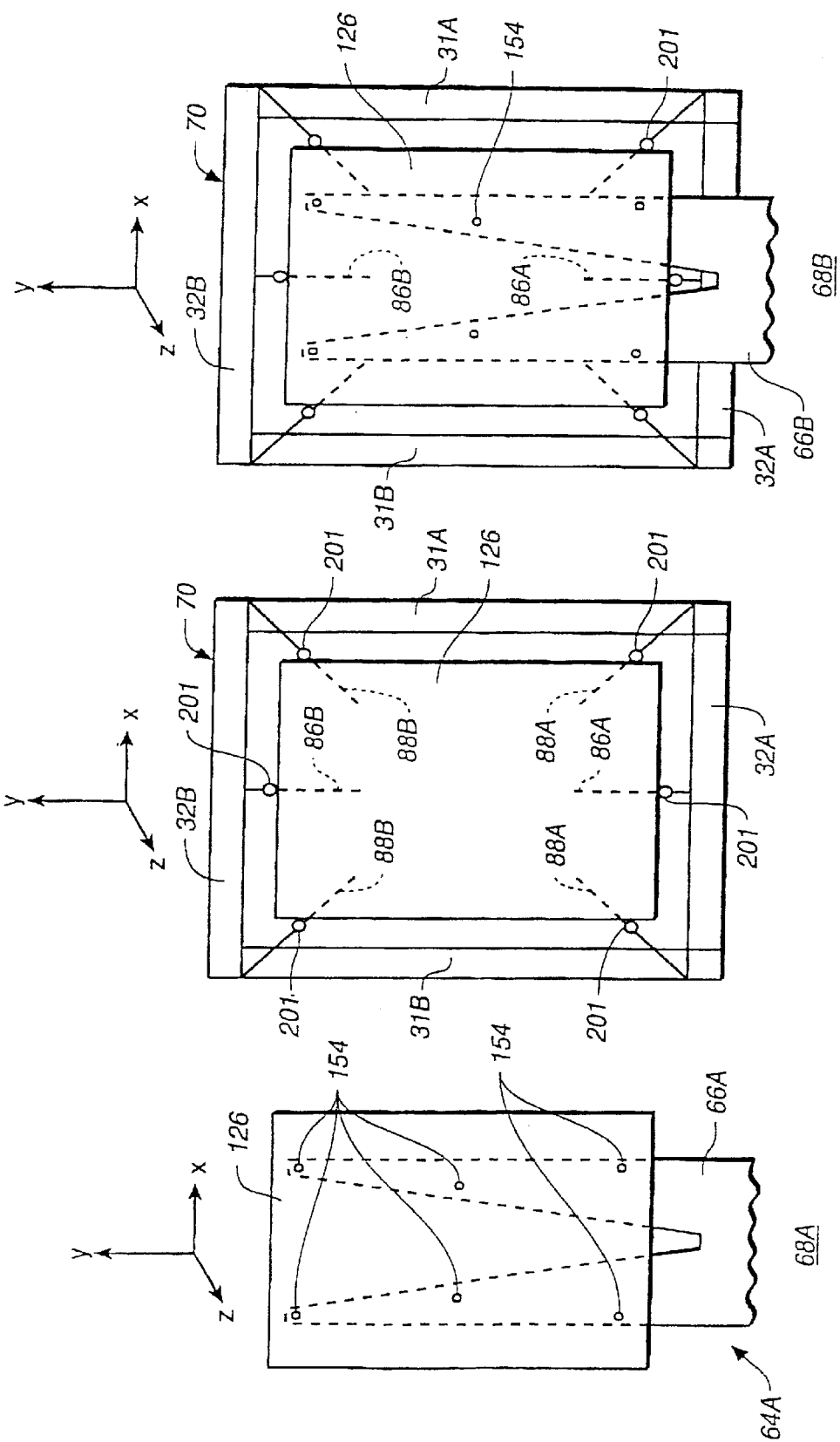

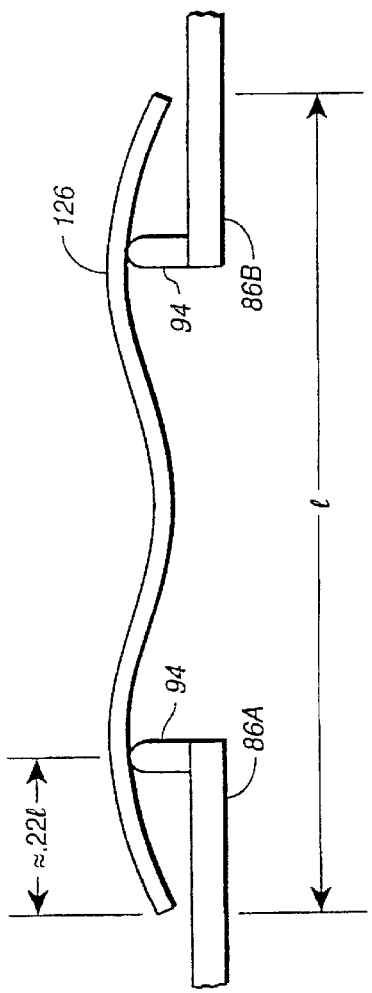
FIG._2D
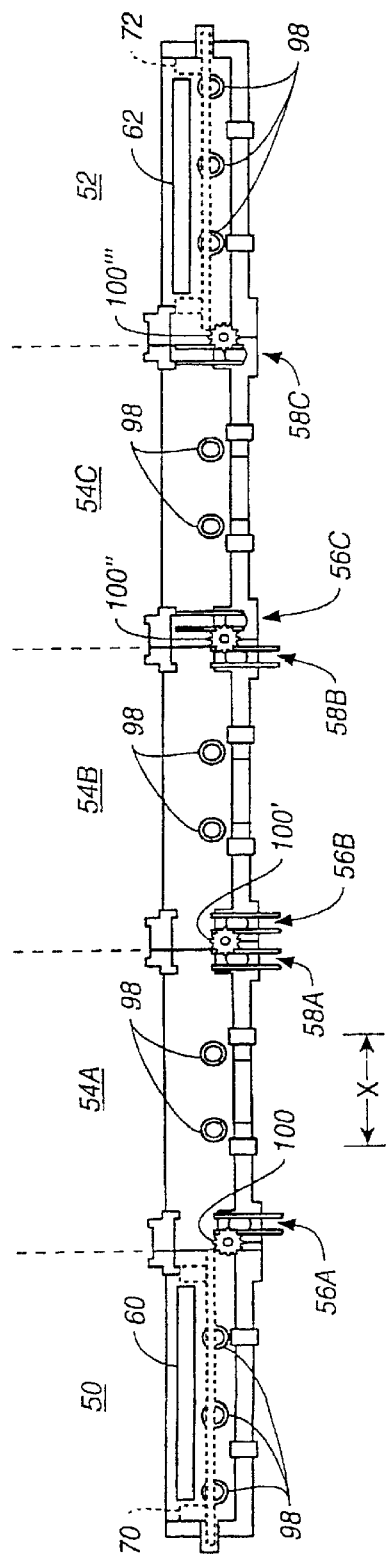
FIG._3

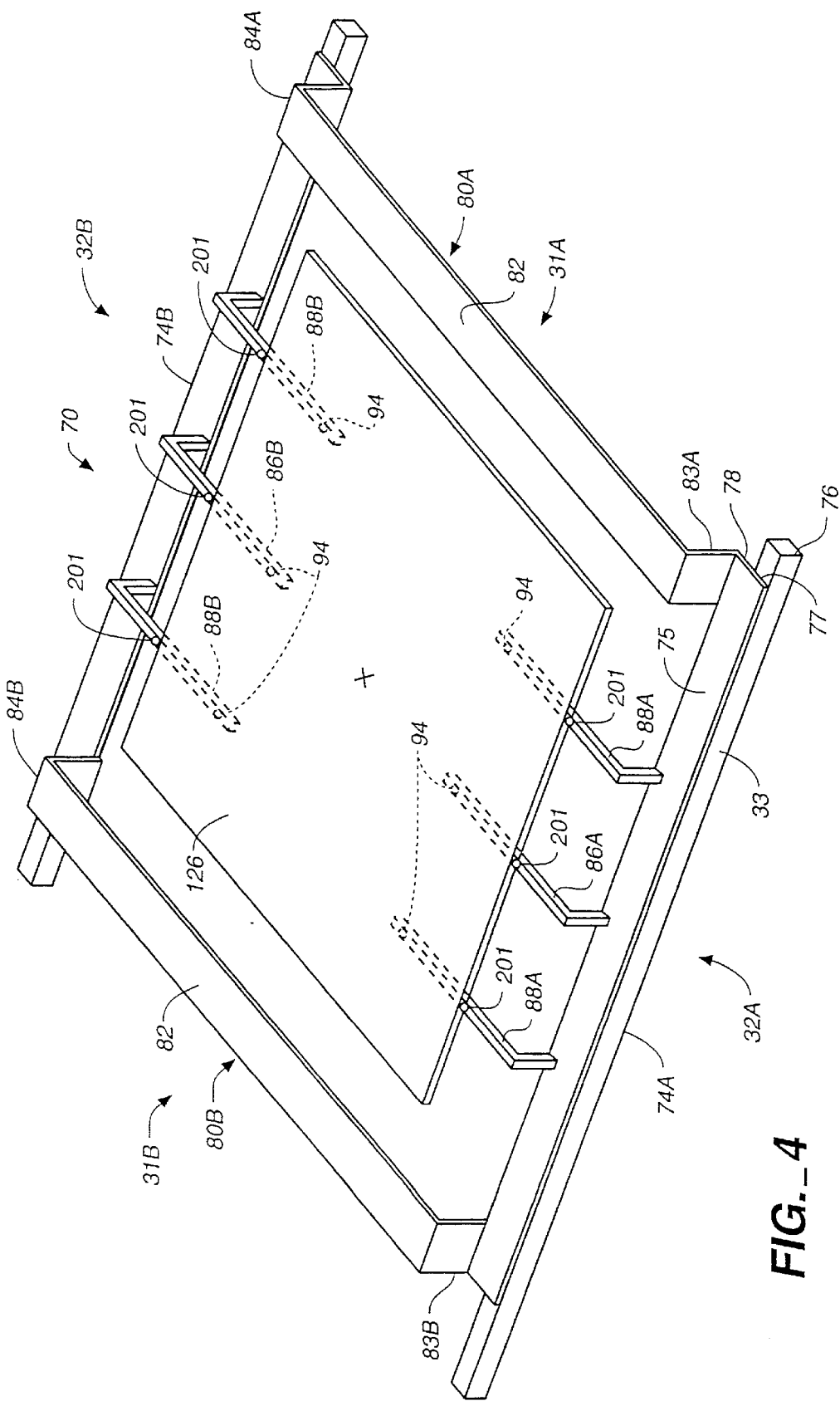
FIG._4

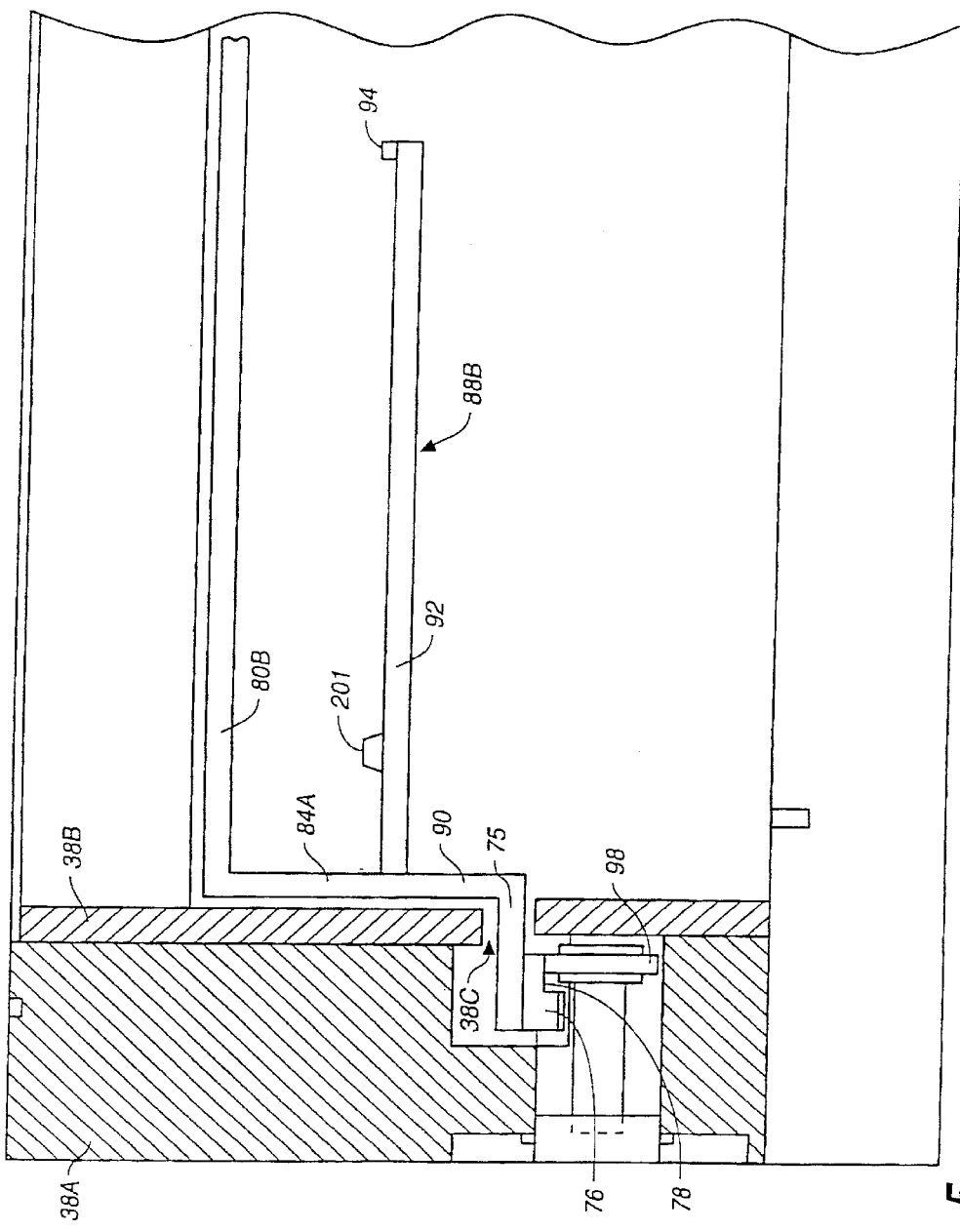
FIG._5

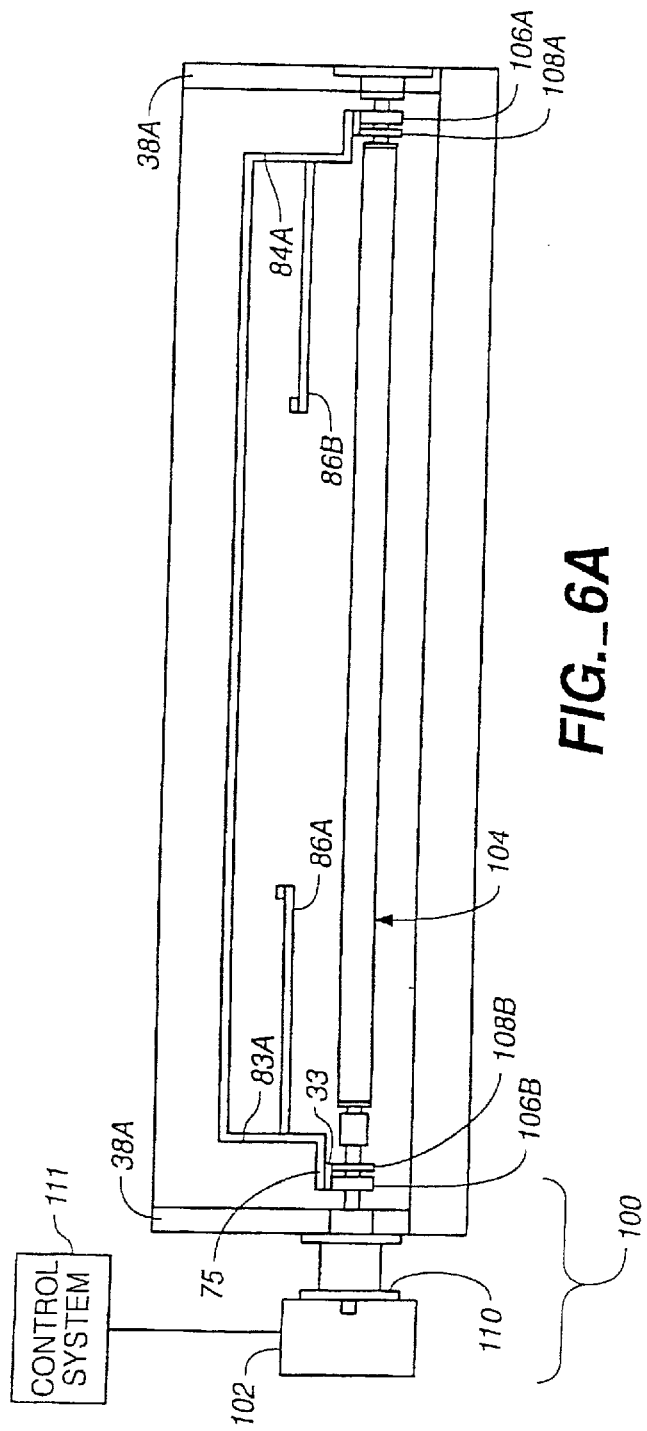
FIG._6A
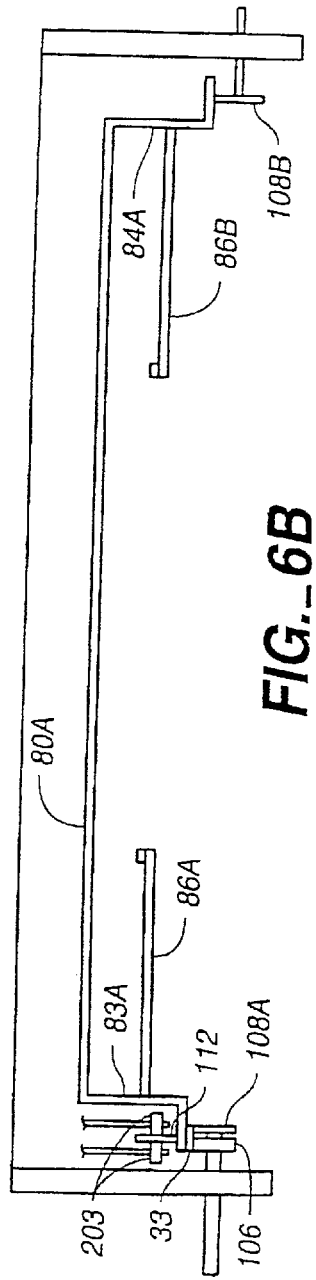
FIG._6B

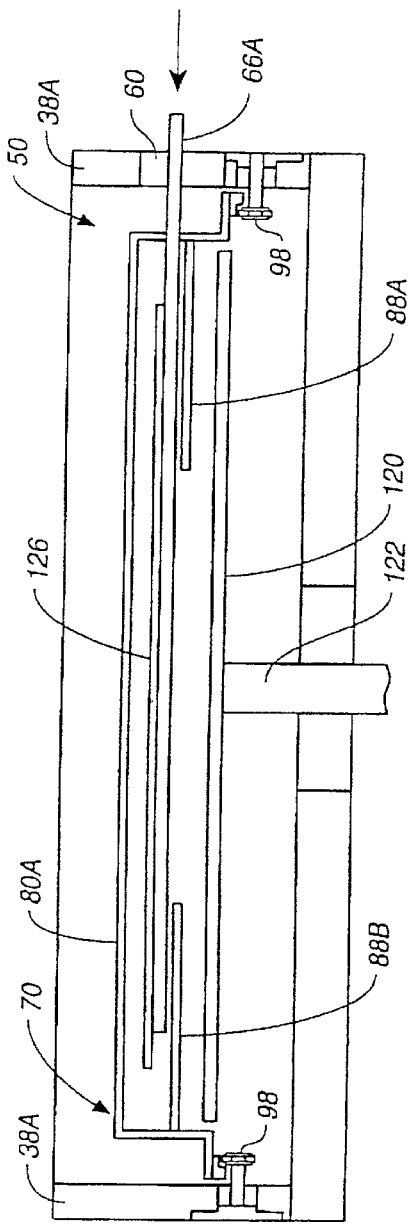
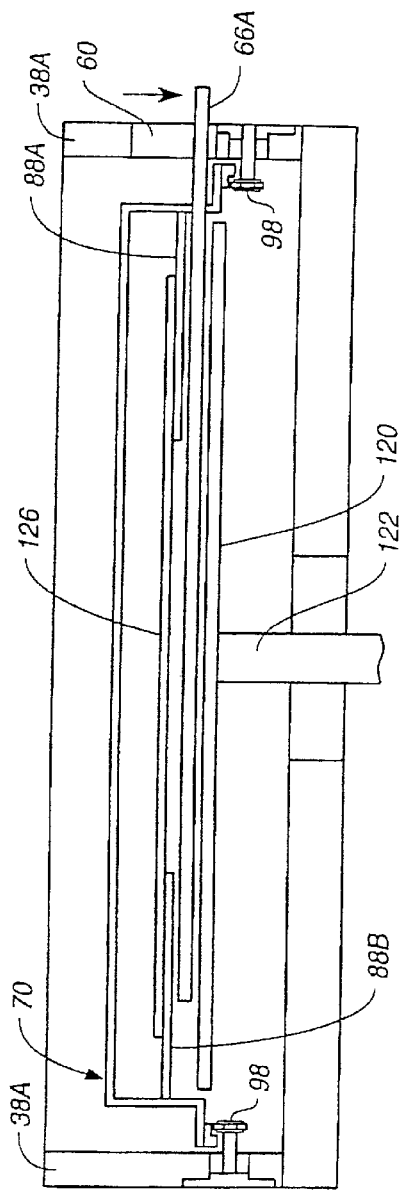
FIG._7A
FIG._7B

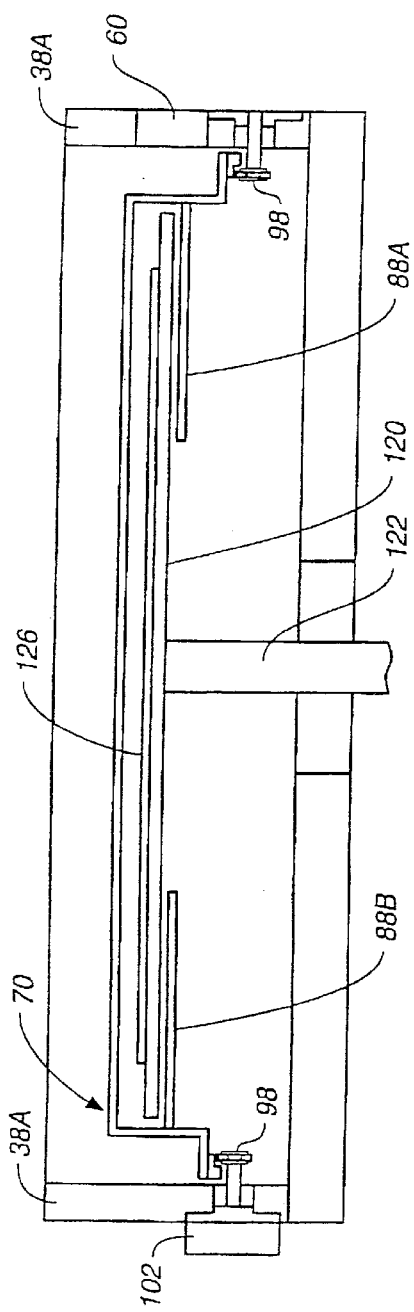
FIG._7C
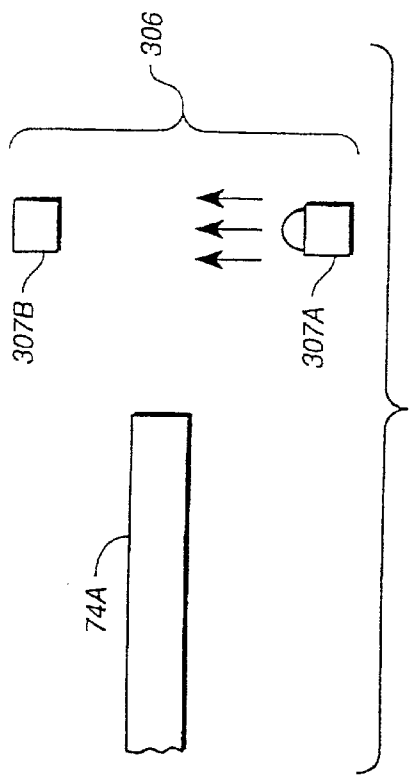
FIG._10A

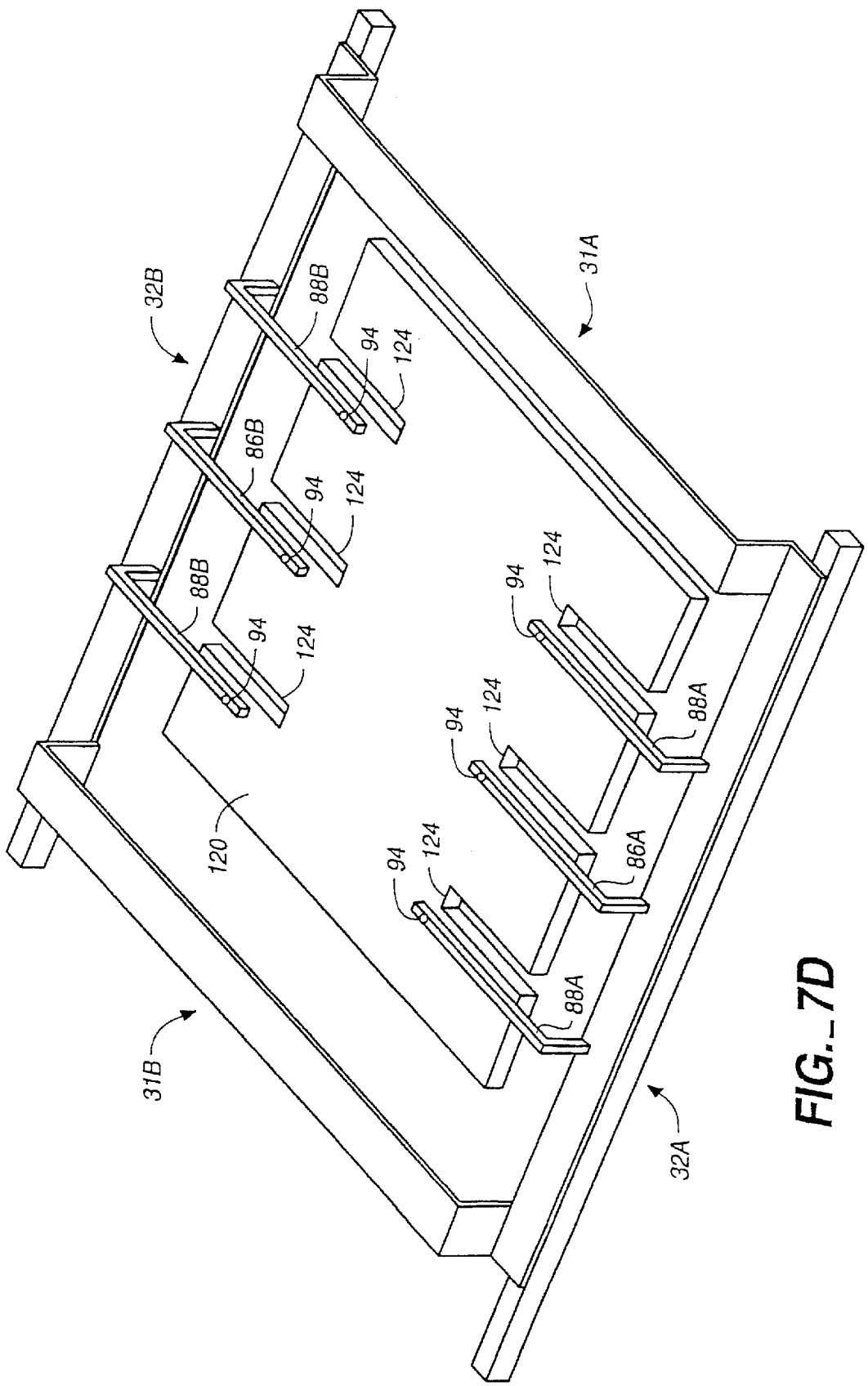
FIG._7D

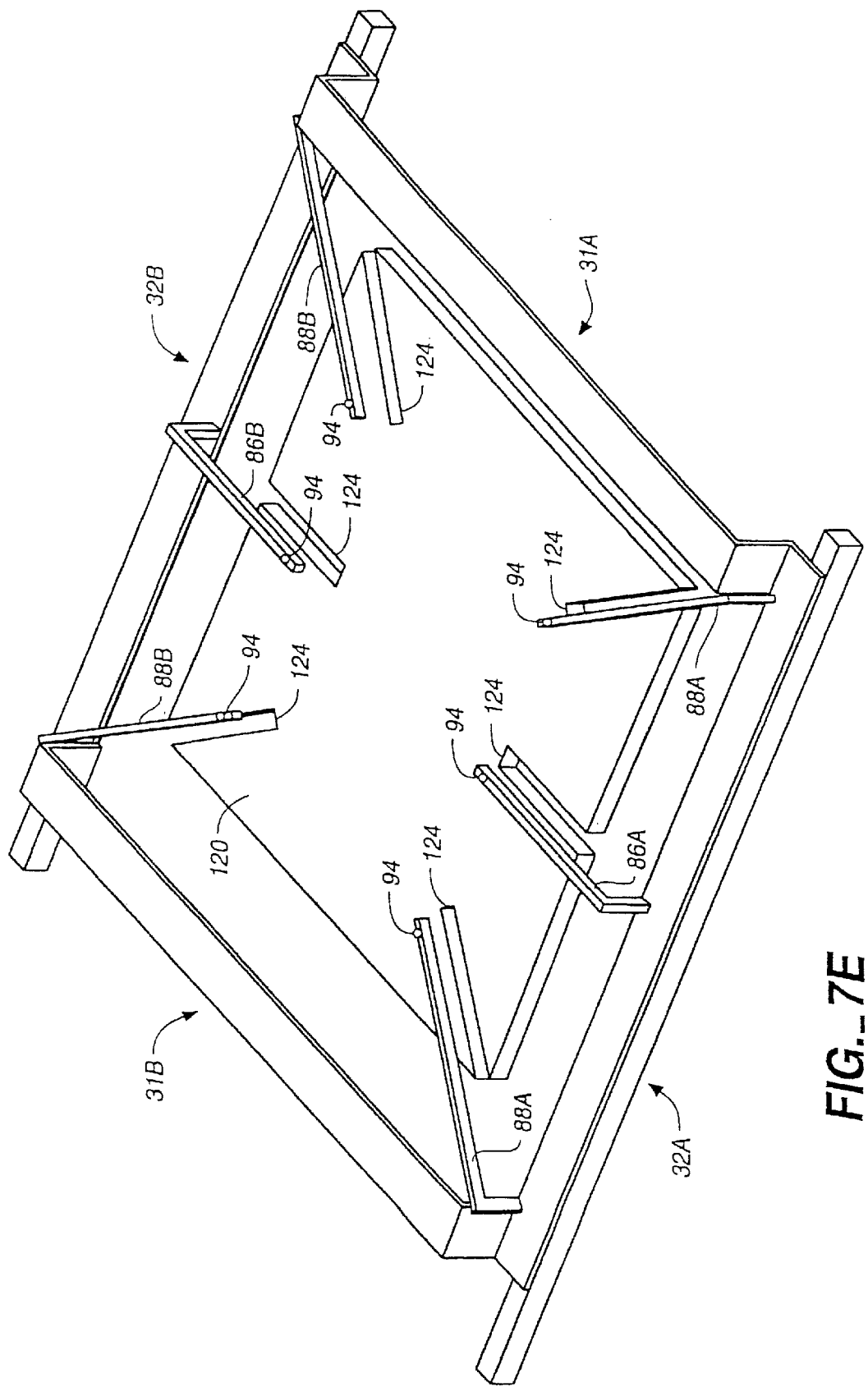

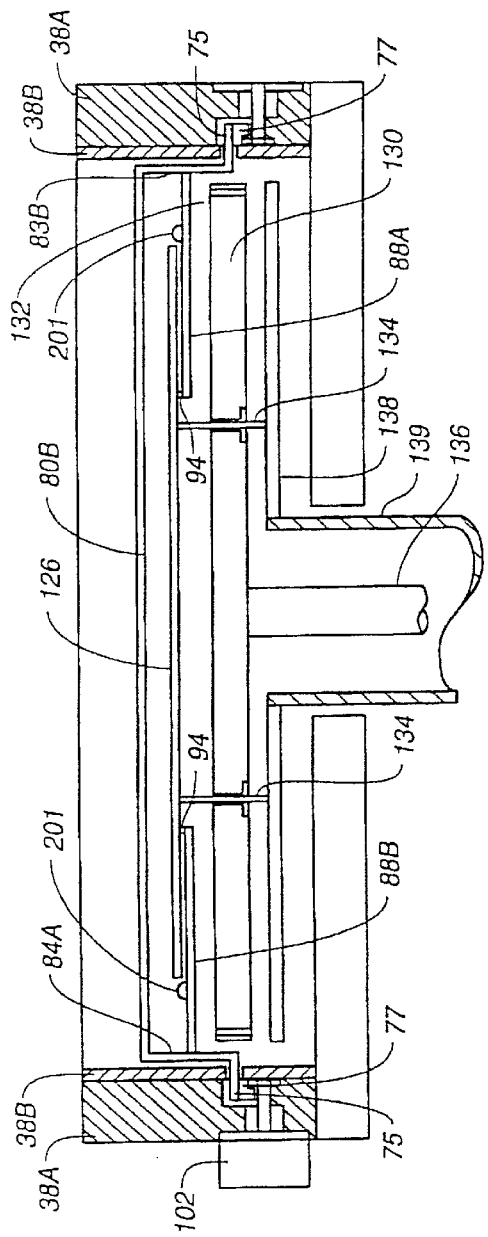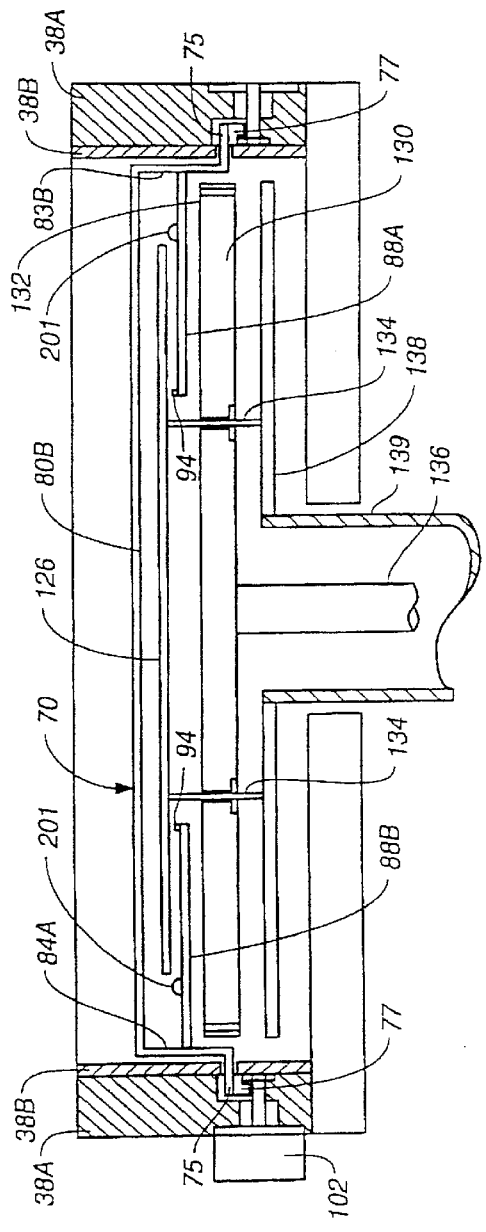

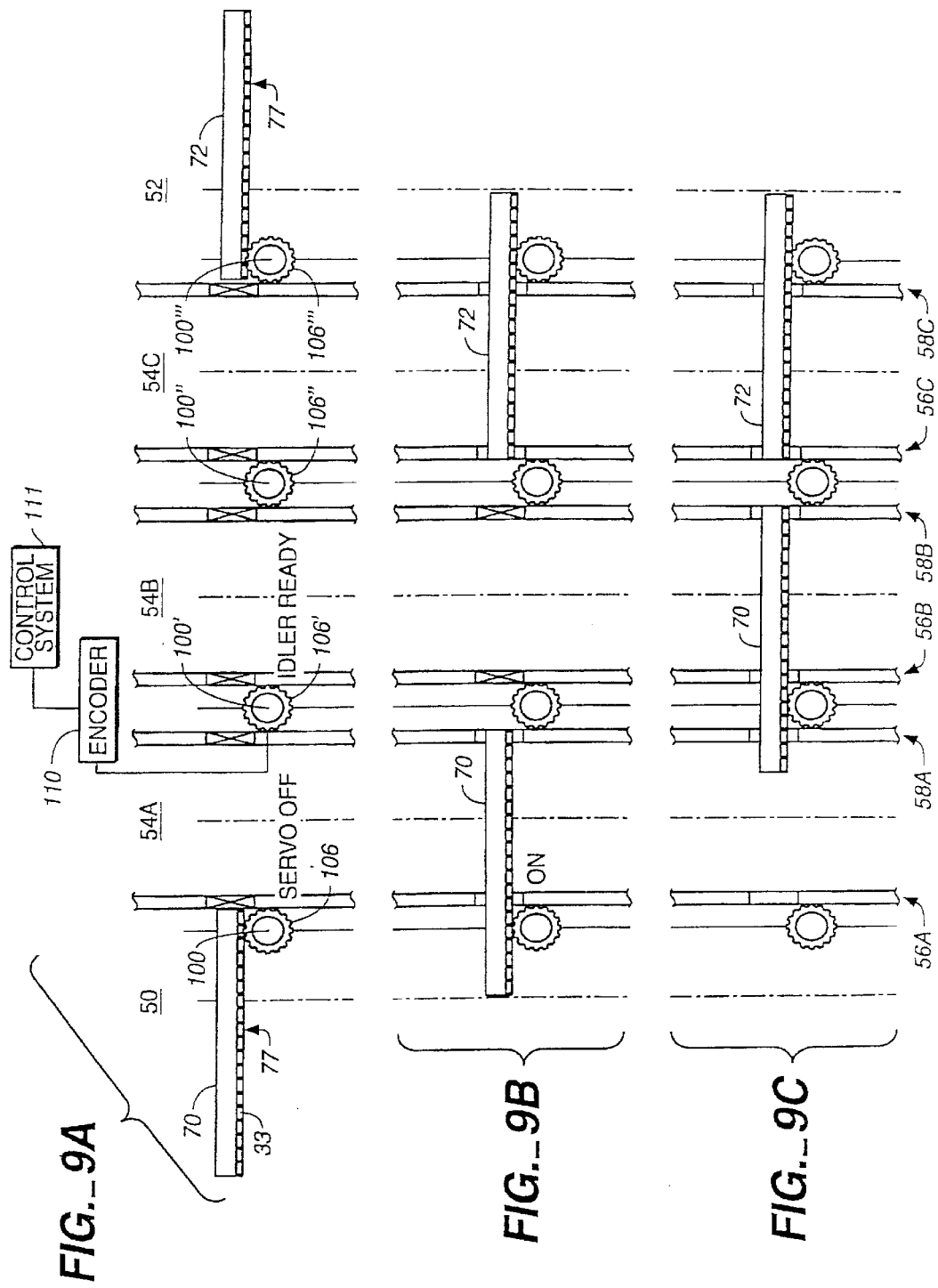

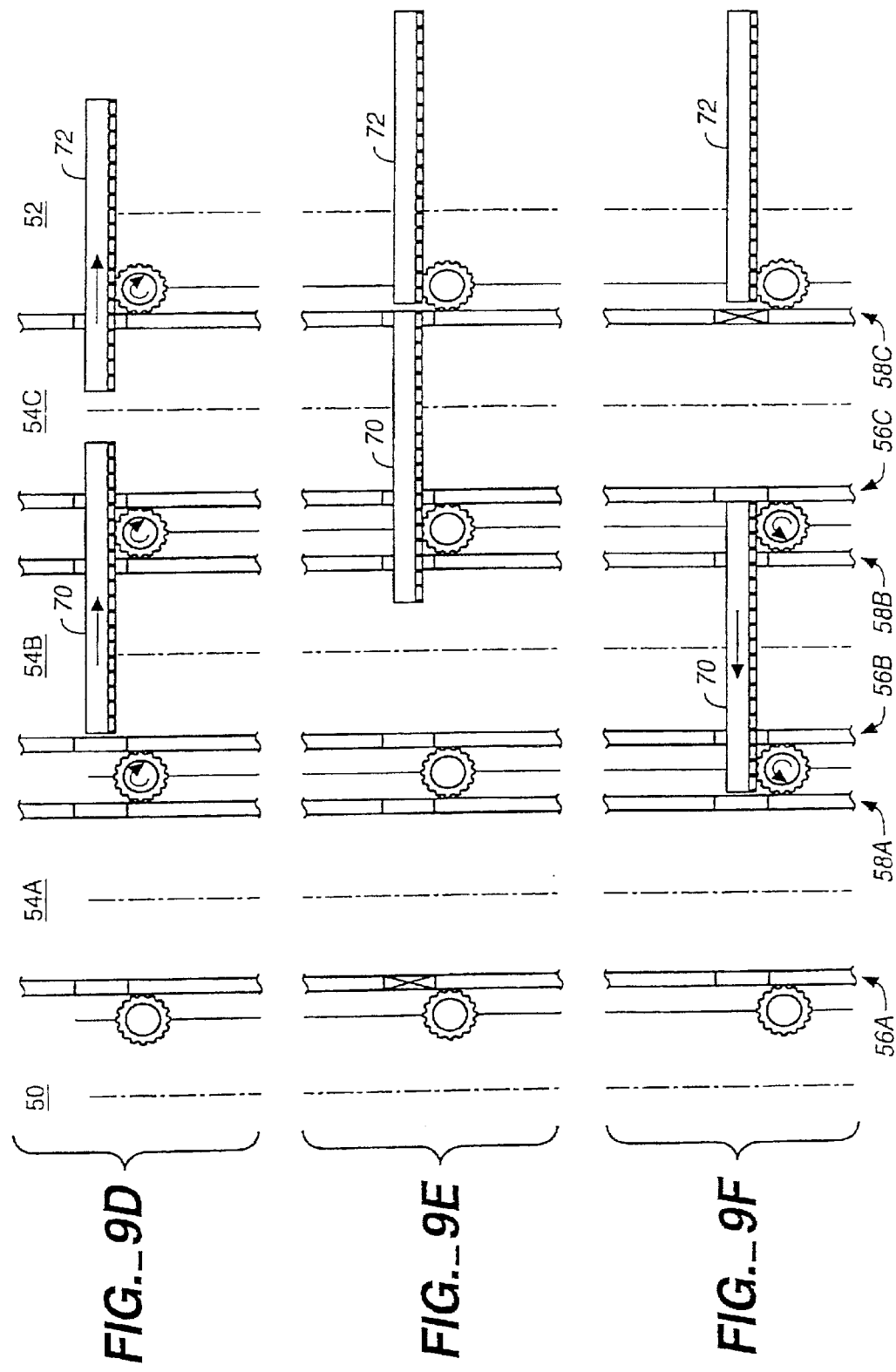

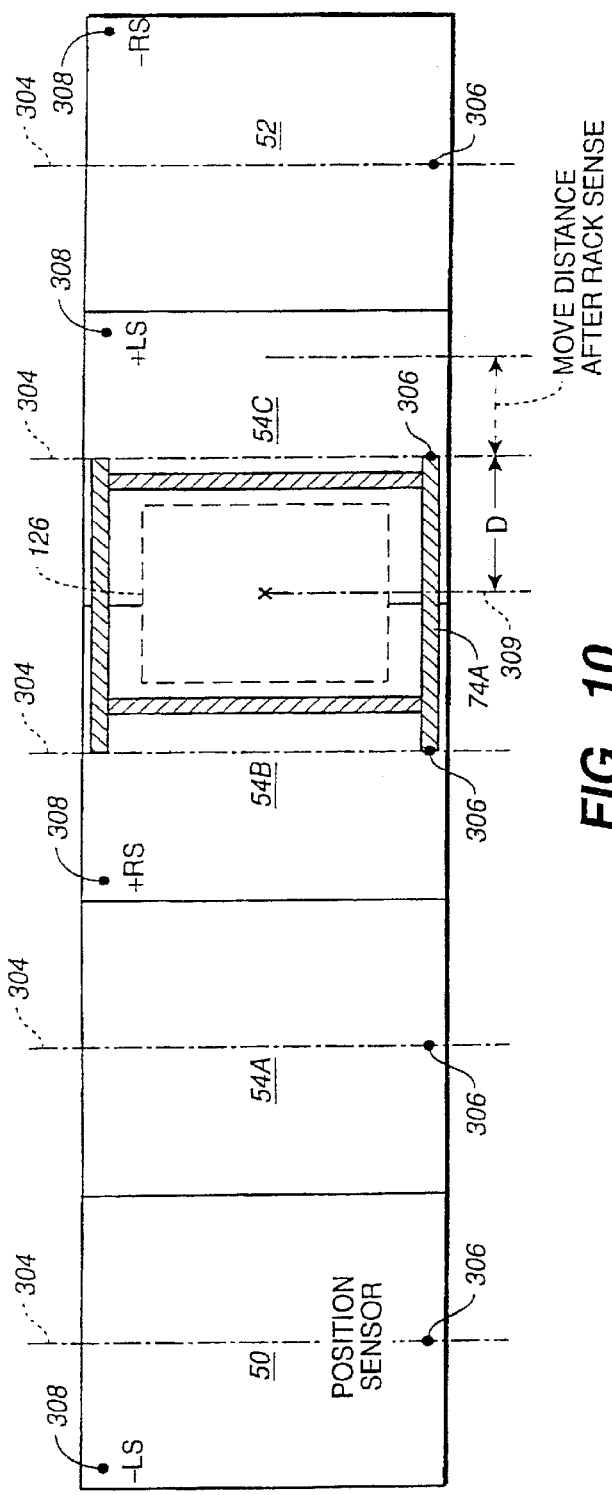
FIG._10
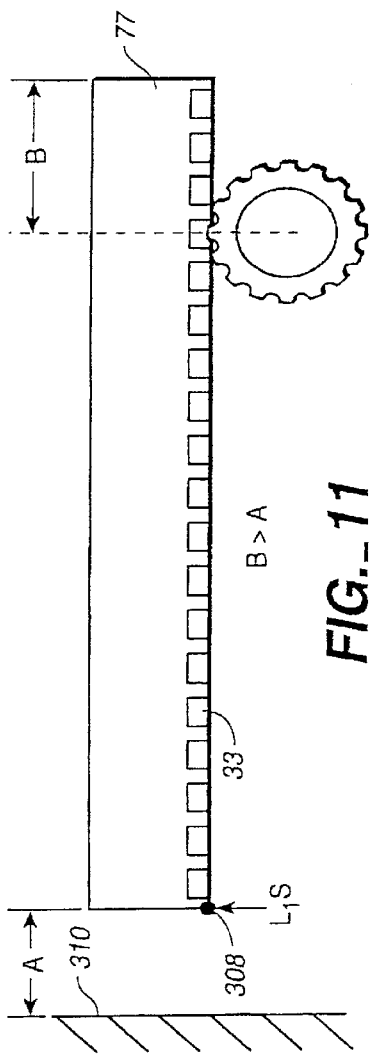
FIG._11

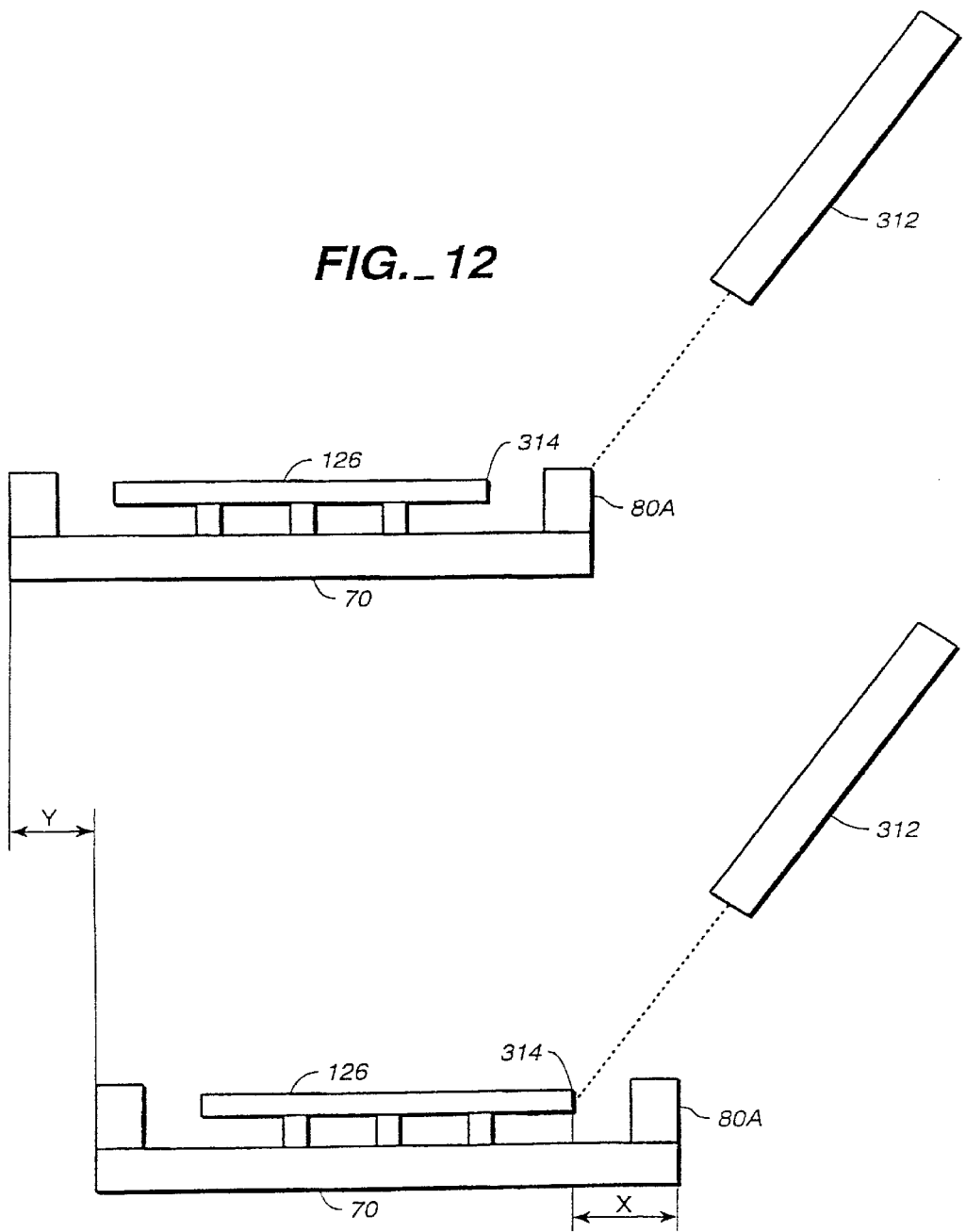
FIG._12

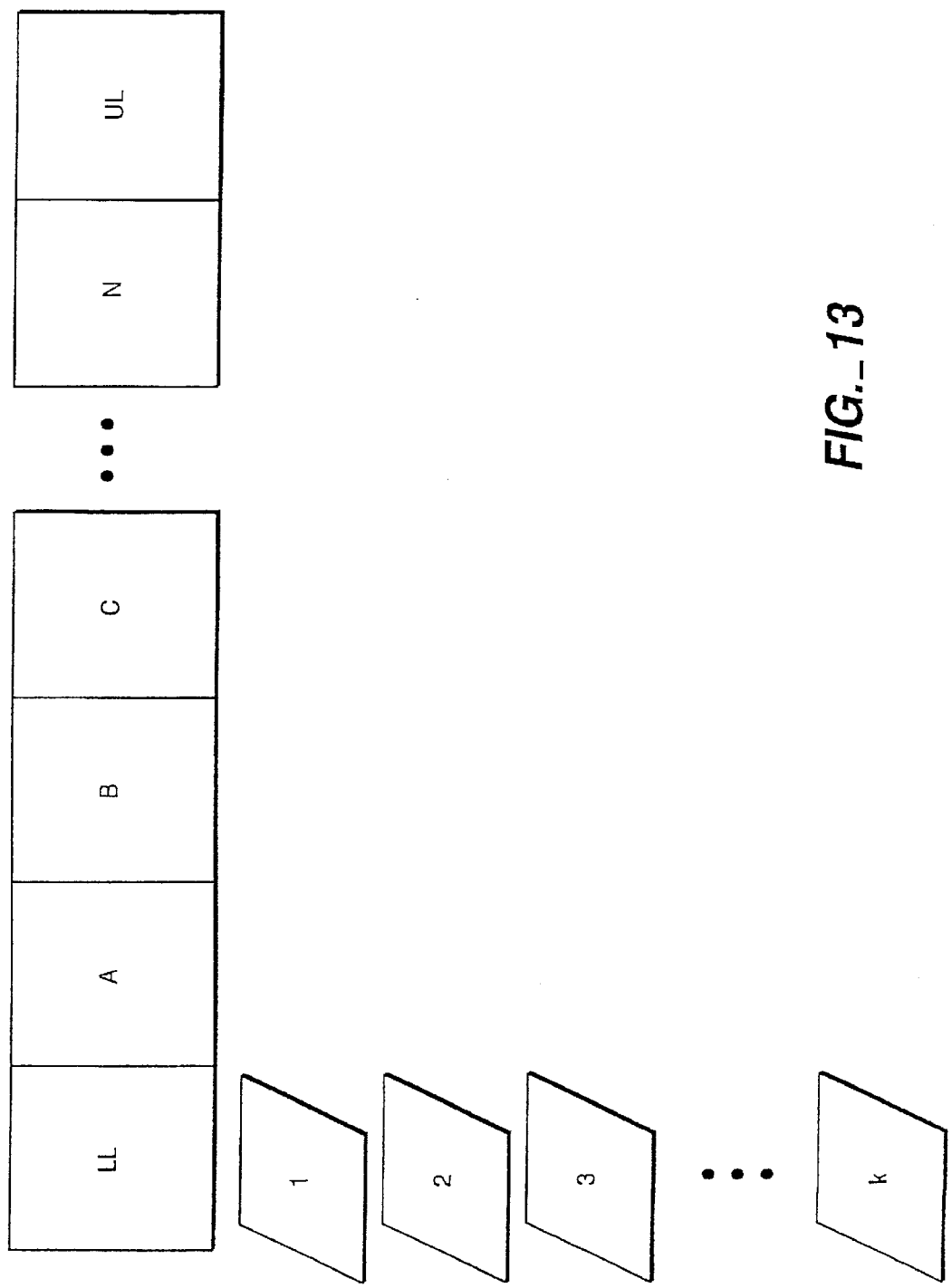
FIG._13

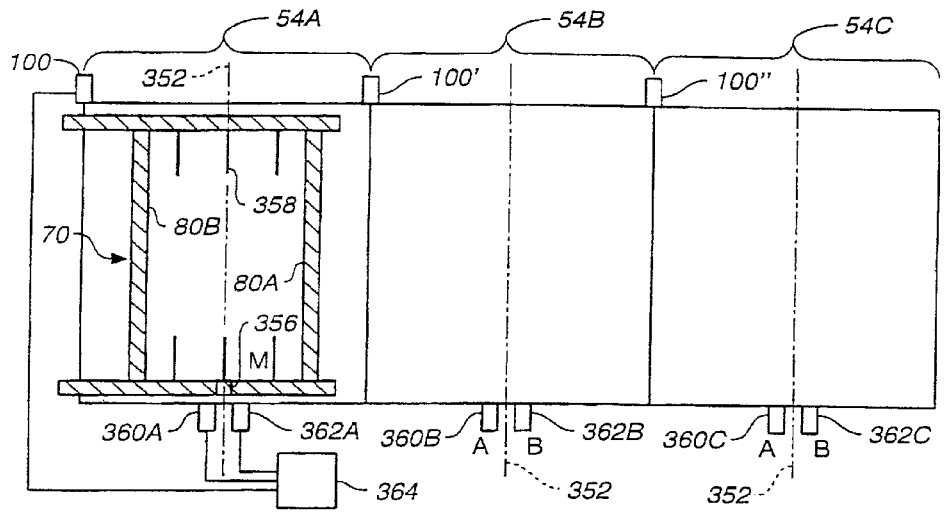
FIG._14
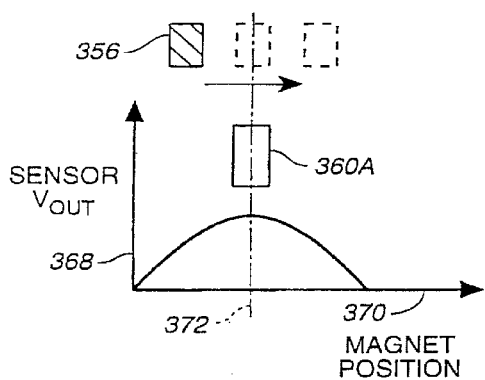
FIG._15
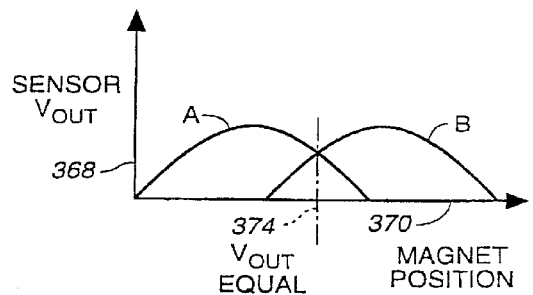
FIG._16
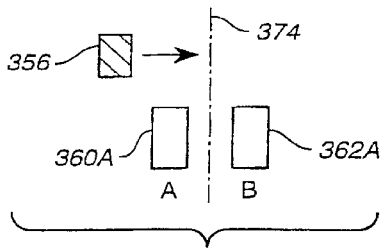
FIG._17

METHOD AND APPARATUS FOR SUBSTRATE TRANSFER AND PROCESSING

RELATED APPLICATIONS

The present application is related to co-pending U.S. patent application Ser. No. 08/946,922, entitled "MODULAR CLUSTER PROCESSING SYSTEM," filed Oct. 8, 1997. The present application is also related to the following U.S. patent applications which are being filed concurrently with this application: (1) "Multi-Function Chamber For A Substrate Processing System" [attorney docket 2712/US/AKT (Ser. No. 09/082,375)]; (2) "An Automated Substrate Processing System" [attorney docket 2429/US/AKT (Ser. No. 09/082,415)]; (3) "Substrate Transfer Shuttle Having a Magnetic Drive" [attorney docket 2638/US/AKT (Ser. No. 09/082,605)]; (4) "Substrate Transfer Shuttle" [attorney docket 2688/US/AKT (Ser. No. 09/082,484)]; (5) "In-Situ Substrate Transfer Shuttle" [attorney docket 2703/US/AKT (Ser. No. 08/082,488)]; and (6) "Modular Substrate Processing System" [attorney docket 2311/US-/AKT (Ser. No. 08/946,922)]; and (7) "Isolation Valves" [attorney docket 2157/US/AKT (Ser. No. 09/082,376)].

The foregoing patent applications, which are assigned to the assignee of the present application, are incorporated herein by reference.

BACKGROUND

The invention relates to substrate processing, and more particularly to transferring substrates to and from processing chambers.

Glass substrates are being used for applications such as active matrix televisions and computer displays, among others. A large glass substrate can form multiple display monitors, each of which may contain more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

One way to improve such processing tools is disclosed in U.S. patent application Ser. No. 08/946,922, entitled "MODULAR CLUSTER PROCESSING SYSTEM," assigned to Applied Komatsu Technologies, Inc. of Santa Clara, Calif., and incorporated above by reference. The use of a modular processing system is disclosed, with substrate movement exterior of processing islands performed by conveyors or robots on tracks. Substrate movement interior of processing islands is performed by a substrate transporter. In this type of system, the transporter may move a substrate into or out of a processing chamber, after which the transporter may stay resident in either load lock.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, relatively few defects can cause an entire monitor formed on the substrate to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby reducing the ability of the system to achieve a high throughput.

As noted above, efficient production line processing requires rapid movement of the glass substrates from one work station or processing island to another. Large glass substrates are particularly cumbersome and fragile, further complicating this process.

SUMMARY

The present invention allows large glass substrates to be rapidly moved within a processing station or from one processing station to another. Such movement occurs such that drives in different chambers are synchronized to move the glass substrates on shuttles at appropriate times. In systems according to one embodiment of the invention, at least a first and second chamber are provided. Typically, the first chamber is a load lock and the second chamber is a processing chamber. The processing chamber may include an inspection station, a CVD chamber, a PECVD chamber, a PVD chamber, a post-anneal chamber, a cleaning chamber, a descumming chamber, an etch chamber, or a combination of such chambers. The load lock may be employed to heat or cool the substrate. Two load locks may be employed, one to perform heating and the other to perform cooling. The load locks each include a platen for supporting the substrate.

A substrate transfer shuttle is used to move a substrate along a guide path defined by, e.g., guide rollers. Drive mechanisms are employed, often between chambers, to drive the shuttle along associated portions of the path. A control system is provided which powers the drive mechanism adjacent the first chamber to drive the substrate transfer shuttle from a first position toward a second position and through an intermediate position. At the intermediate position, the substrate transfer shuttle begins to engage and induce movement of the drive mechanism adjacent the second chamber. The control system receives an input caused by the induced movement of the drive mechanism adjacent the second chamber, this input indicative of the substrate transfer shuttle having moved a predetermined distance beyond the intermediate position. The input may then be used to synchronize movement of the substrate transfer shuttle from the first chamber to the second chamber. Such synchronization may include reducing power to the drive mechanism adjacent the first chamber and/or powering the drive mechanism adjacent the second chamber.

Implementations of the invention may include one or more of the following. Several process chambers may be employed, and the movement of the shuttle into each may be synchronized in the manner above. The synchronization may occur such that the shuttle moves in a forward direction and in a reverse direction. More than one shuttle may be employed, and the multiple shuttles may operate independently.

Sensors may be advantageously employed to detect the shuttle position and thereby to provide a feedback to the drive mechanisms directing the same to change, e.g, drive movement if an error in positioning is detected. In this way, an error correction scheme may be implemented which is distributed over all the process chambers and load locks. The sensors may be, e.g., magnetic or optical. Further, sensors may be employed to ensure that shuttles do not run into the walls of the chamber or run off of drive mechanisms. In this way, shuttles may always be driven by at least one drive mechanism.

The system allows for convenient synchronization of drive components so that a flexible assortment of films may be formed in the semiconductor processing system.

Other advantages of the invention are that it provides for the quick and precise delivery of substrates to precise locations in processing chambers while allowing for chamber expansion due to temperature warm-up. This avoids the need to calibrate the drive mechanisms based upon the operating temperatures of the chambers, facilitating the convenient use of a given chamber to perform processes at different temperatures.

Further advantages of the invention include one or more of the following. The invention eliminates unnecessary substrate movement in a semiconductor or glass TFT processing system. For example, the substrate may be entirely transferred horizontally except for loading and unloading on the susceptor. The invention eliminates more expensive and cumbersome vacuum robots and transfer chamber systems. The invention allows removal of a substrate shuttle from a processing chamber during processing, reducing contamination.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 1 is a top plan schematic view of a processing island of a system according to the present invention.

FIG. 1A is a side schematic view of a section of a load lock employing alcoves.

FIGS. 2A–2C are top plan views of a shuttle and lifting fork according to the present invention.

FIG. 2D is a side schematic view showing a heated bowing glass substrate supported on support fingers.

FIG. 3 is a side schematic view of a processing island of a system according to the present invention.

FIG. 4 is a perspective view of a substrate transfer shuttle according to the present invention.

FIG. 5 is a partial cross-sectional side view of a processing chamber and substrate transfer shuttle according to the present invention.

FIG. 6A is a transverse cross-sectional view of a processing island and shuttle according to an embodiment of the present invention.

FIG. 6B is a transverse cross-sectional view of a processing island and shuttle according to an alternative embodiment of the present invention.

FIGS. 7A–7C are partial schematic cross-sectional views of a load lock chamber according to the present invention, showing a substrate in various stages of transfer from a shuttle to a platen within the load lock chamber.

FIGS. 7D–7E are perspective views of alternative embodiments of a substrate transfer shuttle and platen as support fingers of the shuttle pass through the platen in a load lock chamber.

FIGS. 8A–8B are schematic cross-sectional views of a processing chamber according to the present invention, showing different stages of transfer of a substrate between a shuttle and a susceptor.

FIGS. 9A–9F are partial schematic side views of a two shuttle system according to the present invention.

FIG. 10 is a top schematic view of a multichamber system employing sensors for accurate location of a shuttle according to the present invention.

FIG. 11 is a side schematic view of a photodetector and photoemitter sensor system which may be employed in the present invention.

FIG. 11 is a side schematic view of limit sensor placements according to the present invention.

FIG. 12 is a side schematic view of a laser positioning sensor system which may be employed in a chamber according to the present invention.

FIG. 13 is a schematic diagram of a processing system according to the present invention.

FIG. 14 shows an embodiment of a position finding and in-position verification scheme.

FIG. 15 shows a graph of sensor voltage output versus position of a magnet for a position finding and in-position verification scheme using a single sensor.

FIG. 16 shows a graph of sensor voltage output versus position of a magnet for a position finding and in-position verification scheme using a dual sensor.

FIG. 17 shows the dual sensor design layout for the embodiment of FIG. 16. Like reference numbers and designations in the various drawings indicate like elements.

DETAILED DESCRIPTION

FIG. 1 shows a processing island 42 of a fabrication system according to an embodiment of the present invention. Arrow 101 defines a direction pointing from "upstream" to "downstream" in the processing island. The island 42 includes a substrate heating load lock chamber 50 at a first end of the island and a substrate cooling load lock chamber 52 at a second end of the island, longitudinally opposite and downstream of the first end. Of course, the terms "heating" and "cooling" are not intended to be limiting. Rather, they are descriptive of exemplary features such chambers may possess.

Between the load lock chambers 50 and 52 are a plurality of processing chambers 54A–54C, which are connected in series between the load lock chambers. Each processing chamber 54A–54C includes first and second gate valves 56A–56C and 58A–58C, respectively, at the first and second ends of each processing chamber (see also FIG. 3). The valve 56A selectively seals the load lock chamber 50 from the processing chamber 54A when closed and permits transfer of substrates through the valve 56A when open. Similarly, the valve 58C selectively seals the load lock chamber 52 from the processing chamber 54C in a closed condition and permits the transfer of substrates through the valve in an open condition. The valves 58A and 56B seal the first processing chamber 54A from the second processing chamber 54B when closed and permit the transfer of substrates through the valves when open. Likewise, the valves 58B and 56C selectively seal the second processing chamber 54B from the third processing chamber 54C in closed conditions and permit the transfer of substrates through the valves in open conditions. The pairs of valves 58A, 56B and 58B, 56C may be replaced with single valves although the illustrated configuration has advantages described below. An example of the type of valve which may be employed is described in above-mentioned U.S. Patent Application entitled "Isolation Valves", [attorney docket number 2157 (226001)] filed on even date herewith, and incorporated by reference above.

This detailed description describes an embodiment in which a glass substrate is used. The term "substrate" is intended to broadly cover any object that is being processed in a process chamber, including flat panel displays, glass or ceramic plates, plastic sheets, or disks. The present invention is particularly applicable to large substrates such as glass plates having dimensions of 650 mm by 830 mm or even larger.

In this system, the substrate is supported by support fingers. The support fingers may all be parallel, as shown in the embodiment of FIGS. 1, 4, 7D and 14, or some may be angled as shown in the embodiment of FIGS. 2B–2C and 7E. In the described embodiments, the short dimension of the substrate is generally parallel to the direction of movement within a processing island.

FIGS. 1 and 3 show a substrate transfer shuttle in each of the load locks 50 and 52. As shown in FIG. 3, the load lock chambers 50 and 52 have respective gate or slit valves 60 and 62 positioned along one side of the island. The valves 60 and 62 (FIG. 3) selectively seal their associated load lock chambers from atmosphere in closed conditions and allow introduction or removal of substrates to or from the load lock chambers in open conditions. In FIG. 3, valves 56A, 58A, 56B and 58B are shown open, and valves 56C and 58C are shown closed.

The substrates may be introduced through the valve 60 to the load lock chamber 50 which forms an entrance load lock chamber. With the load lock chamber 50 in a condition sealed from the atmosphere and process chamber 54A, the load lock chamber may be pumped to vacuum and the substrate heated.

The load lock system allows a staged vacuum to occur. That is, the process chamber vacuum need not be breached for substrates to be loaded and unloaded. Since the load locks are independently pumped-down prior to the opening of the valves separating them from the process chambers, the process chamber pumps need only evacuate a chamber that is already partially at vacuum. That is, they need only maintain process vacuum conditions, not develop them. Such a capability is particularly important for, e.g., physical vapor deposition (PVD), which may often require the lowest pressure of any process.

Each load lock chamber may be multifunctional. Process steps such as heating, cooling, and descumming may be provided for in each load lock. Heating and cooling may be provided for by heating and cooling plates which may be moved into and out of thermal contact with the substrate. Typically, the load lock 50 may be used to heat and descum, while the load lock 52 may be used to cool. Ashing processes may also be provided for in the chambers. The substrate is then passed among the processing chambers 54A–54C. In each processing chamber, a specific semiconductor process may be performed on the substrate. Ashing or descumming may also occur in a processing chamber. More details of a multifunctional load lock may be found in above-mentioned U.S. Patent Application entitled "Multi-Function Chamber for a Substrate Processing System," [attorney docket number 2712 (268001)] filed on even date herewith, and incorporated by reference above.

A processed substrate may be cooled in the cooling load lock chamber 52, which forms an exit load lock chamber, and may also be brought up to atmospheric pressure. Thereafter, the substrate may be removed from the system through the valve 62. Introduction and removal of substrates to and from the load lock chambers 50 and 52 may be performed by robots 64A and 64B, respectively (see FIG. 1). Alternatively, just one robot may be employed, operating on a track or conveyor, to introduce or remove substrates.

Each robot includes an end effector in the form of a lifting fork 66A, 66B at the distal end of an arm 68A, 68B. At its proximal end, each arm 68A, 68B is coupled to an associated vertical linear actuator (not shown) to permit the arm and lifting fork to be raised and lowered. Referring to FIGS. 2A and 2C, the top of the lifting forks 66A and 66B may have thereon a number of supports 154 to support a substrate 126 on top of the forks 66A, 66B.

The robot 64A, for instance, can retrieve and return substrates to and from substrate holding cassettes. In a first loading position, the robot 64A may load a substrate into load lock chamber 50 of the island through the gate or slit valve 60 (FIG. 3). Robot 64B operates in a similar fashion to robot 64A. More details of the robots may be found in U.S. Patent Application entitled "Modular Substrate Processing System," filed on even date herewith, and incorporated by reference above. In a first or lowered position, the fork 66A may be inserted beneath a substrate in a cassette or on a shuttle in a load lock chamber. The fork design is such that the same fork may be used for either, facilitating considerable advantage in incorporating the system into existing product lines. When raised to an intermediate position, the upper surface of the fork 66A or, more particularly, supports or pads 154 (see FIGS. 2A and 2C) along the upper surface of the fork tines, engage the lower surface of the substrate 126. When further elevated to a second or raised position, the fork 66A lifts the substrate 126 out of engagement with the cassette or shuttle.

During loading, a z-rotary actuator of the robot 64A is caused to rotate the loading end effector 66A 180° so that the substrate may be introduced into load lock heating chamber 50 through the slit valve 60. Fine adjustments may be made by the z-linear actuator to adjust the height of the substrate 126 so that the substrate 126 may enter through the slit valve 60 (FIG. 3) unimpeded. During substrate loading, the slit valve 60 is opened and the substrate is moved by a y-linear actuator in the y-direction. This movement loads the substrate into load lock chamber 50 where it is lowered onto the shuttle 70 using the z-linear actuator. The empty end effector 66A may then be withdrawn from the chamber. Slit valve 60 is then closed and the heating and evacuation process begun.

Associated with each load lock chamber 50 and 52 is a transfer shuttle 70 and 72, respectively, configured for transporting substrates between chambers. The first and second shuttles 70 and 72 are positioned in the heating and cooling load lock chambers during introduction of a substrate to the heating load lock chamber 50 and removal of a substrate from the cooling load lock chamber 52, respectively. Transfer shuttles 70 and 72 may be made of stainless steel, invar, ceramics or any other similar material. Invar may be preferable as it has a low coefficient of thermal expansion.

The load lock chambers 50 and 52 may be equipped with maintenance windows or slits 152 (FIG. 1). These windows 152 allow the removal of the components from the load locks for maintenance or repair. During such a maintenance situation, both shuttle and chamber components may be repaired.

Referring to FIGS. 1, 2B–2C, 4, and 7D–7E, each shuttle 70, 72 has a first end 31A facing from the associated load lock chamber toward the adjacent processing chamber and a second end 31B opposite the first end. Each shuttle further has first 32A and second 32B sides. The shuttles may be mirror images of each other and are positioned facing each other.

Referring specifically to FIG. 4, each shuttle includes first and second side rails 74A and 74B along the respective first and second sides of the shuttle. Both side rails extend substantially between the first and second ends of the shuttle. The side rails are parallel to and spaced-apart from each other. Each side rail includes a generally flat horizontal strip 75. Along an outboard portion of the underside of each strip 75, the rail bears a rack 76. An outboard portion 77 of the underside of each rack bears angled teeth 33 (the shape of the teeth is not shown). An inboard portion 78 of the underside of each rack is flat for engaging a number of guide rollers as described below. First and second cross-members 80A and 80B, respectively, proximate the first and second ends 31A and 31B of the shuttle, structurally connect the first and second side rails 74A and 74B to each other. Each cross-member is slightly recessed from the associated end of the shuttle, and each cross-member includes a flat central horizontally-extending strip 82. First (83A and 84A) and second (83B and 84B) legs depend from first and second ends of the strip and connect such ends to the first and second side rails, respectively.

An "X" indicates the location of the center of the substrate. This X location should roughly correspond with the center of the processing chamber, as measured in a horizontal plane, for optimum processing of the substrate.

Substrate support fingers 86A, 88A, 86B and 88B extend inwardly from the associated first and second side rails, respectively. Referring to FIGS. 4 and 5, each support finger has a proximal portion 90 extending upwardly from the associated side rail 75 and a distal portion 92 extending horizontally inwardly from the proximal portion and ending at a tip. At the tip, the upper surface of each finger bears a pad 94 for supporting a substrate held by the shuttle. As the shuttle must endure the temperatures used for heating substrates, to temperatures of about 460° C. or even higher, the pads 94 may advantageously be made of a material such as a ceramic, stainless steel, quartz, or other such materials.

It should be noted, however, that the temperature requirements of the substrate transfer shuttle components may be lower than in prior systems. In many prior systems, such as cluster tools, substrates would be removed from a heating chamber by a vacuum robot which would then transport the substrate to a processing chamber, resulting in cooling of the substrate. A solution was to overheat the substrate, intending for it to cool when transported.

In the present invention, the substrate transfer shuttle 70 moves the substrate into a processing chamber directly from the heating chamber. Thus, the requirement for overheating the substrate is alleviated if not eliminated.

FIG. 5 also shows inner and outer chamber walls 38B and 38A, respectively. A slot 38C is located in inner wall 38B to allow the flat rail 75 of the shuttle to extend into the opening in wall 38B to engage rollers 98. In this way, contamination caused by guide rollers 98 may be minimized. Further, the process performed within the chamber is kept separate from the mechanical components causing the shuttle movement.

The width of the lifting forks 66A, 66B may be close to but less than the distance between the two exterior support fingers 88A and 88B along one side of the shuttle 70. The central cut-out section of the fork should be large enough such that it does not interfere with the central support finger 86A. In the embodiment of FIGS. 2B–2C and 7E, where diagonal support fingers are employed, the width of the fork may be larger. In the illustrated preferred embodiment of FIGS. 2B–2C and 7E, there are three support fingers associated with each side rail: a central support finger 86A, 86B and two lateral diagonal support fingers 88A, 88B. Each support finger preferably extends about 15–30% of a dimension, such as the length or the diagonal of the substrate, to adequately support the substrate, and even more preferably approximately 22% of the length (0.22 l) of the substrate. Referring to FIG. 2D, such placement ensures that when a substrate 126 is heated, bowing caused by the substrate flexibility results in a minimal volume swept out by the bowing substrate as it moves along the flow path. In particular, by constructing the fingers 86A, 86B, 88A, and 88B and pads 94 in this configuration, where the pads are located at about the 22% point, a minimal volume is swept out by the bowing substrate as it is moved from one processing chamber to another, or between a processing chamber and a load lock. Thus, the chance of such a substrate striking, e.g., a platen or a susceptor, is substantially reduced. This consideration is particularly important for glass substrates on which TFT's are formed for flat panel displays, as these may be only about 0.7–1 mm thick.

The height of pads 94 is also important. The height should be chosen such that when the heated substrate bows, the edges of the substrate do not make contact with the fingers directly. The importance of this aspect to the quality of the resulting substrate depends on the process requirements.

Another advantage of such a configuration is that the same support fingers may be used to support several different sizes of substrates. Moreover, the location of the support fingers is adjustable to accommodate various substrate sizes. The location of the pads 94 is also variable to accommodate different substrate sizes. It should also be noted that while a shuttle servicing the load lock chamber 50 must be designed to withstand high temperatures, the shuttle servicing load lock chamber 52 has somewhat more forgiving requirements, as it is less inclined to see the maximum processing temperatures.

FIGS. 1, 4, and 7D show the alternate embodiment in which lateral support fingers 88A and 88B are not diagonal but rather are parallel to support fingers 86A and 86B. Other angled fingers may be used, so long as they adequately support the substrate.

The above designs allow each shuttle to accept substrates from two directions, each 90° away from each other. First, the shuttle may accept and release substrates in a direction perpendicular to the side rails 74A and 74B. Second, the shuttle may accept and release substrates in a direction parallel to the side rails 74A and 74B. In any of the embodiments, a plurality of stoppers 201 may be provided, as shown in FIGS. 2B–2C, 4–5 and 8A–8B, to ensure accurate placement of the substrate on the support fingers and to prevent accidental shifting of the substrate on the shuttle during transport. Substrates may also be centered on the fingers by using the plurality of stoppers 201. The stoppers 201 may have the general shape of an inverted truncated cone, such as an inverted frustum.

Along each side of the island (FIGS. 1, 3, 5 and 7A–7C), each load lock chamber and each processing chamber includes a number of pairs of guide rollers 98 (e.g., two rollers per side of the processing chambers and three rollers per side of the load locks) positioned so as to provide support and guidance to one or both shuttles as such shuttles pass through the chambers. The guide rollers 98 may be Teflon®-coated aluminum, Vespel®, or any other such material that is not particulate-generating and is soft for dampening vibrations. Alternatively, suspensions may be employed to provide a smooth movement.

The guide rollers are all at substantially even level and define a fixed path along which the shuttles may move back and forth. The guide rollers are configured to engage the flat inboard portion 78 of the underside of each rack as a shuttle passes over the guide rollers so as to position and orient the shuttle and provide smooth shuttle movement along the predefined path.

Referring to FIG. 3, between each of the processing chambers 54A–54C and the load lock chambers are chamber isolation valves whose housings may each include a shuttle drive mechanism 100. As shown in FIGS. 1, 3, and 9, drive mechanism 100 is between chambers 50 and 54A, drive mechanism 100' is between chambers 54A and 54B, drive mechanism 100" is between chambers 54B and 54C, and drive mechanism 100'41 is between chambers 54C and 52. With respect to drive 100, it is noted that this drive may be considered to be within chamber 50 as there is no valve door between this drive and chamber 50. Thus, we occasionally term this drive the "drive mechanism for the first chamber". Correspondingly, drive mechanism 100' is the "drive mechanism for the second chamber", etc. When discussing these drive generically, the term "drive mechanism 100" is used herein, with the understanding that the discussion generally applies to all such drives. Further, each drive mechanism 100 has associated a pinion gear 106 which engages the rack of the shuttle to move the same along an associated portion of the work flow path. Correspondingly, drive mechanism 100 drives pinion gear 106, drive mechanism 100' drives pinion gear 106', etc.

Such a configuration, in which the drives are located within valve housings, reduces particulate contamination within the processing chambers as is often required, e.g., in TFT formation. Such an island layout also facilitates a high degree of modularity because each chamber has a similar structure and is interchangeable. With one drive mechanism within the housing of each isolation valve, the length of the shuttles used is generally longer, as described in more detail below, than the associated distance between the driving mechanisms. Moreover, the overall length of the shuttles used is generally longer than the length of any process chambers through which they pass.

As shown in FIG. 6A, each drive mechanism 100 includes a motor 102 external to the interior cavity of the associated chamber and coupled to a drive shaft assembly 104 extending into and within the interior of the load lock or valve housing. The inner chamber wall 38B is not shown for clarity. The drive shaft assembly 104 may employ vacuum-compatible rotary feedthroughs. The drive shaft assembly carries first and second pinion gears 106A and 106B adjacent first and second sides of the associated chamber, and first and second guide rollers 108A and 108B immediately inboard of the first and second pinion gears, respectively. The pinion gears may have, e.g., 16 teeth per pinion and are configured to mesh with the toothed outboard portions 33 of the racks while the guide rollers are configured to contact the smooth surface of the inboard portion of the racks of a shuttle passing over the drive mechanism (see also FIGS. 4 and 5). Optionally, the drive mechanism 100 includes an encoder 110 which provides input to a control system 111 responsive to rotation of the associated drive shaft assembly. The control system 111 may be connected to any and each of the various chambers for controlling their operations as well as the operation of any handling or processing equipment external to the island. The control system may comprise a user-programmable computer or other numerical controller incorporating appropriate software or firmware.

FIG. 6B shows an alternate configuration in which no drive shaft is employed. In this configuration, the shuttle is driven from one side only, and the motor may drive a pinion gear 106 without using the drive shaft assembly 104. Laterally positioned guide rollers 203 may be used in addition to guide roller 108A and 108B to ensure that the shuttle moves in a straight horizontal direction and is not caused to misalign due to its only being driven on one side. Rollers 203 are positioned on each side of a guide rail 112 in order to keep the shuttle 70 moving in a straight and controlled direction.

In either of these embodiments, it should be noted that it is not crucial that the guide rollers be inboard of the pinion gears. In fact, in an alternative embodiment, the guide rollers may be outboard of the pinion gears or the relative position may be different on each side of a line of chambers. In yet another embodiment, rollers may be placed on the substrate transfer shuttle and a smooth flat ridge may be located along each side of a line of chambers to support the shuttle guide rollers.

In the following discussion, the placement of a substrate into a load lock chamber is described with respect to FIGS. 7A–7E. In the discussion of FIGS. 7A–7E, the support on which the substrate is placed is referred to as a platen. The platen has slots through which fingers of the shuttle may move when transferring substrates. The placement of a substrate into a process chamber from a load lock chamber is described with respect to FIGS. 8A–8B. In the discussion of FIGS. 8A–8B, the support on which the substrate is placed is referred to as a susceptor. The susceptor has passages with extendable "T"-shaped pins for use in transferring substrates, as described below. It should be noted that the above definitions for platen and susceptor are used herein for clarity. The susceptor in the processing chamber may be equally well termed a "platen" and the platen in the load lock may be equally well termed a "susceptor."

As shown in FIGS. 7A–7C, each load lock chamber 50, 52 (only chamber 50 is shown) includes a platen 120 for supporting a substrate during heating or cooling prior to or after processing. A pedestal 122 supports the platen 120 and is raisable and lowerable to raise and lower the platen 120 between a first or retracted position and a second or extended position. The platen 120 is generally rectangular and slightly larger than the plan area of the substrate 126 and has a plurality of channels 124 (FIGS. 7D and 7E) extending inwardly from the opposite sides of the platen. The channels are configured so as to accommodate the fingers 86A, 86B, 88A, and 88B of a shuttle 70 (or 72) when the platen 120 is raised or lowered through such a shuttle 70 as described below.

Initially, the load lock chamber 50 is vacant and is shielded from the adjacent chamber 54A by the valve 56A. The load lock chamber 50 is vented to atmosphere and its slit valve 60 is opened to permit introduction of a substrate to the interior of the island. As shown in FIG. 7A, a substrate 126 is loaded into the load lock chamber 50 by the robot end effector 66A. FIGS. 7A–7C show essentially a downstream view of the island. The end effector and substrate are inserted via a horizontal (y-direction) movement into the chamber 50 at a height at which the underside of the end effector 66A is above the fingers 88A, 88B of the shuttle 70. The end effector 66A carrying the substrate 126 is stopped with the substrate 126 located centrally above the platen and then lowered by the z-linear actuator. Eventually, the end effector 66A reaches a second height shown in FIG. 7B. During movement between the first height and the second height, the end effector passes below the fingers of the shuttle, with e.g., one tine of the end effector 66A passing on each side of the central fingers 86A and 86B and just inboard of adjacent lateral support fingers 88A, 88B. When the upper surface of the end effector 66A reaches the height of the pads 94 at the tip of the fingers, the pads 94 engage the underside of the substrate 126 causing the shuttle 70 to acquire the substrate 126 from the end effector 66A. When the end effector 66A reaches the position shown in FIG. 7B, it may be withdrawn from the load lock chamber 50 via horizontal translation. Once the end effector 66A is withdrawn, the valve 60 may be closed and the chamber 50 pumped down.

The platen 120 may then be raised from its initial height in FIG. 7A to a raised height shown in FIG. 7C. During movement between the initial height and the raised height, the platen 120 passes around the fingers of the shuttle, each finger being accommodated by an associated one of the channels 124 (see FIGS. 7D and 7E). When the upper surface of the platen 120 contacts the underside of the substrate 126, it raises the substrate 126 off of the fingers (more particularly, pads 94) to acquire the substrate 126 from the shuttle 70. The shuttle may then be maintained in the load lock chamber or moved to a processing chamber.

With the substrate 126 held by the platen 120 as shown in FIG. 7C, the substrate 126 may be heated or otherwise prepared to ready it for processing.

A multiple substrate cassette (not shown) may also be employed in the load lock chambers 50 or 52. By repeating the above procedure for each substrate in a multiple substrate cassette, the load lock chambers may be used as buffers for storage of substrates prior to or following processing. More details of a multiple substrate cassette are provided in above-mentioned U.S. Patent Application for an "In-Situ Substrate Transfer Shuttle," [attorney docket number 2703(266001)], filed on even date herewith, and incorporated by reference above.

Once the substrate 126 is heated, the platen 120 may be lowered and returned to the position of FIG. 7B, with the shuttle 70 reacquiring the substrate 126 from the platen 120 in the process.

With a substrate 126 supported on the shuttle 70 in the load lock chamber 50, after any heating of the substrate 126 and pump down of the load lock chamber 50 and of the first processing chamber 54A, the valve 56A may be opened to establish communication between the load lock chamber 50 and the processing chamber 54A. With the shuttle in this initial position, the pinion gears of the drive mechanism 100 of the load lock 50 are engaged to the racks of the shuttle 70 adjacent the downstream ends of the shuttle's rails. To move the substrate into the processing chamber, the motor of the drive mechanism 100 may be powered so as to move the shuttle downstream through the valve 56A and into the first processing chamber. When the shuttle reaches a target position in the first processing chamber 54A, its movement is stopped, leaving the shuttle and substrate in the target position.

As shown in FIGS. 8A–8B, each processing chamber includes a susceptor 130 for supporting a substrate 126 during processing. The plan area of the susceptor 130 is slightly larger than that of the substrate 126 and the susceptor 130 has an upper surface 132 configured to contact substantially the entire underside of the substrate 126 during processing. The upper surface 132 of the susceptor 130 is continuous except for interruptions caused by the presence of passages for lift pins 134 which may extend through the susceptor 130 from below. As illustrated, the susceptor 130 has a central pedestal 136 which may be raised and lowered to raise and lower the susceptor 130. The lift pins 134 are secured at their lower ends to a pin plate 138. The pins and pin plate are generally raised and lowered by an outer shaft 139 which surrounds the central pedestal 136. In one embodiment, lift pins 134 and pin plate 138 move independently from susceptor 130. Lift pins 134 support a substrate when they are in an extended position. As the lift pins are retracted, the substrate is lowered onto the susceptor 130. When the susceptor 130 is caused to rise, the lift pins are caused to retract to a position below the surface 132 of the susceptor 130. The pins may pass below surface 132 by virtue of a counterbore located within surface 132.

This embodiment allows a convenient way of transferring support of the substrate from the lift pins 134 to the susceptor 130 as the susceptor 130 is raised. More details of this pin system may be found in U.S. patent application Ser. No. 08/950,277, entitled "A Vacuum Processing System Having Improved Substrate Heating and Cooling", filed Oct. 14, 1997 [attorney docket 1881/US/AKT (05542/182001)], assigned to the assignee of the present invention and incorporated herein by reference.

In the illustrated embodiment, each chamber includes six lift pins 134 arranged in pairs extending from upstream to downstream in the chamber. Like the support fingers and for the same reasons, the lift pins 134 may also be advantageously located at about 15–30% of the dimension of the substrate 126 and more preferably about 22% of the width of the substrate 126. They may even more preferably be located just inside of the distal end of the pad 94 location. While it would be preferable to have both the pins and the pads 94 at the 22% point, such placement would not allow the same to pass around each other. Thus, it may be advantageous to have the pins and pads close to each other, but to have the pins just nearer to the centerline of the substrate than the pads. In this way, relative movement can be accomplished without contact.

The lift pins 134 may have the general cross-sectional shape of a "T". A corresponding counterbore, as mentioned above, may be placed in the susceptor 130 around the lift pin holes so that the lift pins, when fully retracted, are below the level of the top surface 132 of the susceptor 130. The substrate then does not contact the lift pins in their retracted positions. In this way, the lift pins have a minimal thermal signature. In other words, the lift pins 134, and their passages through the susceptor 130, do not significantly affect the even distribution of temperature across the susceptor 130 and thus across the substrate 126. Thus, the high process requirements with regard to uniformity of temperature for, e.g, TFT formation may be advantageously achieved.

When the shuttle 70 carrying the substrate 126 enters the processing chamber 54A, the substrate 126 and shuttle fingers 86A, 86B, 88A, and 88B pass over the susceptor 130 which is at a first height as shown in FIG. 8A. The lift pins 134 may be in an extended position relative to the susceptor 130 (as shown in FIGS. 8A and 8B) or may be in a retracted position. When the substrate 126 and shuttle 70 are stopped in a target position immediately above the susceptor 130, the susceptor 130 and/or lift pins 134 are raised. As lift pin plate 138, lift pins 134, and/or the susceptor 130 are raised, the pins (stationary and in the extended position) contact the underside of the substrate 126 (FIG. 8A) and raise the substrate 126 out of the engagement with the shuttle 70 (FIG. 8B). With the substrate 126 in this intermediate position, the shuttle 70 may be withdrawn from the processing chamber 54A, with the fingers 86A, 86B, 88A, and 88B passing around the lift pins 134 and between the substrate 126 and the susceptor 130, at least one of the cross members 80A, 80B of the shuttle 70 passing over the substrate 126. The shuttle 70 may be withdrawn to the load lock chamber 50 or may be driven into the second processing chamber 54B or therebeyond, e.g., to service other substrates by transporting the same to other chambers, etc. Once, however, the shuttle 70 is out of the chamber 54A, the chamber 54A may be sealed by shutting the valve 56A (and valves 58A and 56B if these have been opened). The lift pins 134 may then be lowered relative to the susceptor 130 to place the substrate atop the susceptor 130.

At this point, processing may begin. When processing is complete and any process gases evacuated (if necessary), the valve 56A may be opened, establishing communication between the load lock chamber 50 and the processing chamber 54A. Of course, valves 58A and 56B may also be opened if the shuttle has been sent downstream. The lift pins 134 and pin plate 138 may then be raised, thus raising the substrate above the susceptor 130 such that the substrate is supported on the lift pins. The shuttle 70 is returned to the processing chamber 54A in a similar fashion as when delivering the substrate 126 to the processing chamber 54A.

As the shuttle approaches a target position, the fingers 86A, 86B, 88A, and 88B pass between the substrate 126 and the susceptor 130, passing around the lift pins 134. The cross-member 80A passes over the substrate 126. When the shuttle 70 reaches the target position, the susceptor 130 and/or pins 134 may be lowered to the position of FIG. 8A, during which the fingers 86A, 86B, 88A, 88B acquire the substrate 126 from the pins 134.

At this point, the substrate 126 may be delivered to the second processing chamber 54B through valves 58A and 56B. The steps of this transfer may be similar to the steps involved in the transfer from the load lock chamber 50 to the first processing chamber 54A. Via a similar process, the substrate 126 may be transferred to the third processing chamber 54C. This may be done with either of the shuttles 70 and 72. Finally, the substrate may be withdrawn from the third processing chamber 54C into the load lock chamber 52 by the shuttle 72 via a reverse of steps similar to those performed with the shuttle 70 in transferring the substrate from the load lock chamber 50 to the first processing chamber 54A.

Similarly, the extraction of the substrate 126 from the cooling load lock chamber 52 by the robot end effector 68B may be performed by substantially reversing the steps used with the robot end effector 66A in introducing the substrate 126 to the heating load lock chamber 50.

The use of lift pins 134 provides another advantage. In any of the chambers, lift pins 134 may be used to elevate the substrate 126 above the heated or cooled susceptor 130 or platen 120. Such elevation may be maintained for as long as necessary to bring the substrate temperature to a desired level. For example, if the substrate 126 is to be cooled, but the susceptor 130 is at a high temperature, maintaining the pins 134 in an elevated position may be useful for cooling the substrate 126.

The drive mechanisms 100 may be synchronized so as to smoothly transfer or hand off the shuttles from one drive mechanism to another. In the illustrated embodiment, referring back to FIG. 1, there is a drive mechanism 100 between each processing chamber and between the load locks and their adjacent processing chamber. More particularly, as noted above, because the drive mechanisms 100 and 100''' are not separated by valves from their adjacent load lock chambers 50 and 52, respectively, we consider them here to be within these load lock chambers. The rails 74A and 74B of the shuttle 70 are sufficiently long to span the drive mechanisms 100 of adjacent chambers. Thus, to move the shuttle from the heating load lock chamber 50 to the first processing chamber 54A, only the drive mechanism 100 of the load lock chamber 50 need be utilized. However, to further move the shuttle to the second processing chamber 54B, the shuttle must be switched or handed off from being driven by the drive mechanism 100 of the load lock chamber 50 to being driven by that between first chamber 54A and second chamber 54B (i.e., drive mechanism 100' and pinion gear 106'). In this exemplary situation, the shuttle is driven from the heating load lock chamber 50 straight to the second processing chamber 54B without stopping.

Control of the drive mechanisms to effect this and other movements are shown in FIGS. 9A–9F. Initially, as shown in FIG. 9A, the shuttle 70 resides in an operative position in the load lock chamber 50, with the teeth 33 of the racks 77 engaged to the pinion gear 106 of the drive mechanism 100. Similarly, the shuttle 72 resides in an operative position in the load lock chamber 52. The pinion gear 106 of the drive mechanism 100 moves the shuttle 70 into the first processing chamber 54A and into the target position (FIG. 9B) of the first processing chamber 54A (in the target position, the shuttle 70 would be able to exchange the substrate with the chamber's susceptor 130). Similarly, the pinion gear 106''' of the drive mechanism 100''' moves the shuttle 72 into the third processing chamber 54C and into the target position (FIG. 9B) of the third processing chamber 54C.

At this point in the movement, as shown in FIG. 9B, if the shuttle 70 were to exchange a substrate with the susceptor in processing chamber 54A, its movement would be stopped in this position and the substrate exchanged. However, in this example the shuttle 70 is described as if it were to exchange a substrate with the susceptor in processing chamber 54B and thus its movement is continuing.

Also, as can be seen at this point in the movement, shuttles 70 and 72 have moved in opposite directions. The shuttle 70 is moving downstream, and the shuttle 72 moved upstream. The shuttle 70, moving to process chamber 54B, proceeds until its rack 77 engages the pinion gear 106' of the drive mechanism 100'. The shuttle 72, moving only to process chamber 54C, proceeds but stops prior to its rack 77 contacting pinion gear 106'' or 100''. In fact, in this example, the shuttle 72 is only shown as being driven by pinion gear 106''' of drive mechanism 100'41 .

In the case of shuttle 72, which may be retrieving a processed substrate from chamber 54C, this would signify the end of this phase of movement (FIG. 9C). In the case of shuttle 70, transfer of control from drive mechanism 100 to drive mechanism 100' may be accomplished in a number of ways. For example, upon engagement of shuttle 70 with drive mechanism 100', the driving force imparted by the previous drive mechanism 100 causes the racks 77 to induce rotation of the pinion gear 106' of the drive mechanism 100'. This induced rotation causes the encoder 110 of the drive mechanism 100' to provide an input to control system 111 (see also FIG. 6A). Only one encoder 1 10 and control system 111 are shown, but it is understood that each drive mechanism 100 has an encoder and that each encoder is couple to the control system 111.

In a preferred embodiment, the initial rotation of pinion gear 106 may be used to provide a signal to the control system 111 such that pinion gear 106' is also caused to rotate at the same time as pinion gear 106. In this way, each starts rotating at the same time. In yet another alternative embodiment, the rotation of pinion gear 106' may start after the rotation of pinion gear 106, but prior to pinion gear 106' being induced to move by the force of the shuttle 70 contacting pinion gear 106'. Such rotation of pinion gear 106' may be caused by a signal from control system 111, this signal triggered by rotation of pinion gear 106, although perhaps delayed in a predetermined manner.

In any of these embodiments, if each pinion gear is "clocked" to each other pinion gear, as described below, then each pinion gear is capable of maintaining a fixed angular relationship with respect to each other. For example, if one pinion gear has a tooth in the twelve o'clock position at a given time, then the control system is capable of rotating adjacent pinions such that they have a tooth in the twelve o'clock position at the given time. Furthermore, the control system is capable of rotating each pinion gear at the same speed so as to transfer substrates on different shuttles at the same velocity. In other words, the control system 111 may rotate all the gears at the proper speed and angular position such that when a shuttle engages a given gear, it does so in a firm manner.

Referring to FIG. 9C, the shuttle 70 is shown in a target position in process chamber 54B. In this position, the shuttle 70 may exchange a substrate with a susceptor in chamber 54B. As may be seen, the shuttle 70 is under control of pinion gear 106' and drive mechanism 100'. In this target position, shuttle 70 is in chamber 54B and shuttle 72 is in adjacent chamber 54C. In this case, the shuttles stop their movement prior to contacting pinion gear 106''. In this way, the shuttle 70 can service chamber 54B and the shuttle 72 can service chamber 54C without having their rails collide just above and on the centerline of pinion gear 106''. The shuttle 70 may partially extend through valve 58B, and shuttle 72 may partially extend through valve 56C, but they do not go so far as to contact each other or pinion gear 106''.

Referring to FIG. 9D, the control system 111 may cause a simultaneous movement of adjacent shuttles in adjacent chambers to the right or left (a rightward movement is shown). In this case, the shuttles 70 and 72 are moving simultaneously and in the same direction.

Referring to FIG. 9E, which shows the result of the rightward movement of FIG. 9D, the shuttle 70 is shown servicing chamber 54C. The shuttle 72 is shown having returned to the chamber 52.

Referring to FIG. 9F, the shuttle 70 is shown moving to the left in order to return to another chamber. In this figure, the shuttle 70 is shown passing through chamber 54B. With valve 58C closed, the shuttle 72 is in a position whereby removal of a substrate may be accomplished in the manner described above.

Referring to the movement of shuttle 70 between FIGS. 9B and 9C, when the control system indicates that the shuttle 70 has moved a predetermined distance beyond the initial point of engagement with pinion gear 106', so that secure engagement of the pinion gear 106' of the drive mechanism 100' to the racks may be assumed, in one embodiment the control system 111 powers the motor of the drive mechanism 100' and may reduce or eliminate power to the motor of the drive mechanism 100. Thus, continued movement of the shuttle 70 is provided by the drive mechanism 100'. In a preferred embodiment, as described above, the control system has already powered pinion gear 106' and drive mechanism 100'.

By similar processes, substrates may be arbitrarily moved to any chamber via almost any shuttle. Of course, only shuttle 70 services load lock 50 and only shuttle 72 services load lock 52. Appropriate control of valves 56A–56C and 58A–58C are also shown in these figures. The details of other movements are substantially similar to those described above.

One way to further ensure a smooth transfer is to precalibrate or "clock" the pinion gears 106. To precalibrate the gears, a shuttle 70 may be placed onto two adjacent pinion gears, with the toothed rack of the shuttle engaging each gear. Either or both gears may be slightly rotated to provide the best contact of each gear to the rack. This "clocks" the adjacent gears so that the control system is then capable of rotating gears in phase with each other. Furthermore, this operation may be performed at an operating temperature of the system so that thermal expansion is taken into account. In the preferred embodiment, then, when a rack is traveling from a first pinion to a second pinion, the second pinion is caused to rotate at the same time as the first pinion is caused to rotate. By rotating at the same time, the second pinion maintains its "clocked" orientation at all times with respect to the first. Thus, when a rack reaches the second pinion, the second pinion is precisely timed to contact and engage the rack is a well-oriented manner.

The drive mechanisms 100 may be powered on command of the control system. The determination of when such a command is given may be based on information from the various encoders and/or drive mechanisms in the system. Such information may be used to determine where various shuttles in the system are located, their current state of motion, and what drive mechanisms require powering to achieve synchronization.

In the case where two adjacent processing chambers, such as chambers 54A and 54B, are performing identical processes, the substrates may be loaded into the processing chambers as described above. That is, a substrate is loaded into chamber 54B, the process in chamber 54B begins, and then the next substrate is loaded in chamber 54A. In this way, TACT times may be generally minimized.

Some descriptions of process orderings will now be given with respect to FIG. 13. The reference letters are for purposes of describing the nomenclature of the Tables I and II below. The loading load lock is shown by LL, process chambers by A through N, and the unloading load lock by UL. Substrates 1-k, to be processed, are also shown. Generally, capital letters are used for process chambers and lower case letters or numbers are used for substrates. The following notations are also used: Hj=heating of substrate j Cj=cooling of substrate j PjK=processing of substrate j in process chamber K TK=processing time for a substrate in process chamber K TL=time required to load a substrate TC=time required to cool a substrate

TABLE I

One film system, each process chamber performs same process
If TL and TC are much less than TK, then in this system
the substrates may be loaded and processed as follows:

| Step | Action(s) |
|---|---|
| 1 | 1 into LL |
| 2 | 1 into N, 2 into LL |
| 3 | 2 into (N-1), 3 into LL, P1N |
| 4 | 3 into (N-2), 4 into LL, P1N, P2(N-1) |
| . | . |
| . | . |
| . | . |
| X | . . . . 1 into UL, etc. |

In other words, the last processing chamber is loaded first, so that when processing is completed on the substrate in the last processing chamber, it may be offloaded immediately into the unloading load lock. Other processes are an extension of this.

TABLE II

Two film system, two process chambers (A and B)

| Step | Action(s) |
|---|---|
| 1 | 1 into LL |
| 2 | 1 into A, 2 into LL |
| 3 | P1A |
| 4 | 1 into B, 2 into A |
| 5 | P1B, P2A |
| 6 | 1 into UL, 2 into B |
| 7 | P2B |
| 8 | 2 into UL |

Other recipes may be developed, according to the process desired.

As mentioned above, all of the motors may be driven by one multiple access controller card such that each follows a controlled motion profile. In this way, slow increases in velocity are used during power-ups to a constant velocity and slow decreases during powerdowns. In the exemplary embodiment, where the shuttle is moving from load lock 50 to chamber 54B, when the motors reach a constant velocity, the shuttle may be about halfway through the total move distance. The drive mechanism 100' (see FIGS. 9A–9F) associated with chamber 54B accepts the shuttle while it is at constant velocity, and it is this drive mechanism which then performs most of the deceleration. Generally, drive mechanisms engage either at points of increasing velocity, decreasing velocity, or constant velocity, and more generally engage and disengage at low velocities.

When a substrate is entering a chosen chamber, such as chamber 54B, a sensor may be used to determine when the substrate and shuttle are in their target positions. This is particularly important in cases where substrate heating is sufficient to lead to thermal expansion of the shuttle components. In such cases, predetermined positions, such as those determined when the shuttle and substrate are cool, are not reproducible. Thus, active sensing of substrate and shuttle positioning becomes important.

In particular, a processing chamber may be subject to thermal expansion caused by heating of the chamber. If a given chamber or type of chamber is used to perform processes at different temperatures, the amount of expansion will differ amongst the various uses. Where, for example, the position of a substrate is controlled relative to an entrance to the chamber, if the substrate delivery system is set to deliver the substrate into alignment with a target position in the chamber at a first temperature, the substrate may not be aligned with the target when the chamber is at a second temperature.

Referring to FIG. 10, each chamber has a transverse center plane 304. Each transverse center plane 304 extends transverse to the shuttle path through the associated chamber and is coincident with a target location defined by the transverse centerline of a substrate when such substrate is in the desired position for processing in the chamber. Each processing chamber includes a sensor 306 located substantially within the transverse center plane 304 of such chamber. The location of the center of the chamber is substantially invariant with respect to temperature, even though the location of outer portions of the chambers may change due to thermal expansion. The position of the sensor 306 is thus substantially invariant with respect to temperature relative to the target location for placing a substrate in the chamber. Also, due to the symmetry, both the right and left shuttles can use the same set of sensors easily.

The sensor 306 is configured to interact with a triggering feature of a shuttle passing by the sensor 306 along the shuttle path. In the illustrated embodiment of FIG. 10, the sensor 306 may comprise a photoemitter 307A directing a beam of light toward a photodetector 307B. The beam of light may be broken by a leading edge of a shuttle rail 74A passing adjacent the sensor 306. The breaking of the beam causes the sensor to deliver an input signal to the control system 111 indicating that the shuttle has reached an intermediate location in the processing chamber, short of the target location. As illustrated in FIG. 10, the leading edges of the rails are positioned a predetermined distance D forward of a substrate-carrying location on the shuttle 70 defined by the transverse centerline 309 of a substrate 126 held in a desired position on the shuttle 70. In response to receiving the input signal from the sensor, the control system permits the shuttle 70 to be driven further forward from the intermediate location, terminating movement of the shuttle 70 when the shuttle 70 has moved forward by the same distance D so that the shuttle 70 comes to a stop in the desired position to transfer the substrate to the chamber. Error correction may also be employed as described below.

Once the substrate transfer shuttle 70 is located in the desired position, the substrate may be placed on the susceptor 130 as described above, which may include being placed on lift pins. The substrate may then be processed as desired.

A number of factors may influence the design of the system and, most particularly, the selection of the appropriate distance D. All other factors being equal, maximizing positional accuracy would be associated with minimizing the distance D. However, to allow a smooth controlled deceleration of the shuttle and substrate (if during delivery), a larger distance D is favored.

Movement of the shuttle by the predetermined distance D may be associated with a predetermined rotation of a drive gear or other drive element. The consistency of the distance D is itself affected by thermal expansion of the shuttle and components of the drive mechanism such as the drive gear. The effect of such expansion may be reduced to insignificance (relative to expansion of the chamber) in a variety of ways.

First, the shuttle and pinion gear may be formed of material having a much lower coefficient of thermal expansion (CTE) than other materials used in construction of the processing chambers. For example, the use of INVAR 36 steel in the shuttle and pinion gears significantly reduces such effects. The linear CTE of INVAR 36 steel is $0.54 \times 10^{-6}/°$ C., approximately 1/30th that of conventional stainless steel and 1/40th that of aluminum.

Second, as shown in FIG. 3, the drive mechanisms may be separated from the processing sections of the processing chambers by their location within the housings of the valves 56A–56C and 58A–58C. Thus the drive mechanisms may not be subject to the same temperature extremes as are remaining portions of the processing chambers.

Finally, in the illustrated embodiments, during processing, the shuttles reside outside the chambers performing such processing and are not subject to the temperature extremes of other system components.

Other sensing systems could also be used. For example, referring to FIG. 12, a laser 312 may be used to sense the leading edge of a cross-member 80A of shuttle 70 instead of the photodetector 307B above.

The laser may also be used to detect misalignment of the substrate on the shuttle 70. After the shuttle 70 moves a distance "x", the laser 312 may be used to sense the leading edge 314 of the substrate 126. As the laser stays fixed, the time between sensing events, multiplied by the known shuttle speed, equals the distance y. Alternatively, an encoder 110 (see FIG. 6A) may be used to note the motor position when the laser senses these events. The system has stored in memory a known predetermined optimal distance for the distance between the substrate and the outer edge of the cross-member. Therefore, if x is equal to this optimal distance, the substrate is properly aligned on the shuttle. If not, appropriate steps may be taken to overdrive or underdrive the drive mechanism to ensure that the substrate is placed in the correct target position for a given chamber.

In another embodiment, as shown in FIG. 14, a shuttle 70 is shown located on the center line 352 of a first processing chamber 54A. Of course, this system may be extended to load locks or other types of chambers. A magnet 356 is mounted on the shuttle 70 at its center line 358. Here, the centerline 358 is coincident with the centerline 352 of the chamber 54A and is substantially equivalent with respect to cross-members 80A and 80B. Two magnetic sensors 360A and 362A, which may be Hall effect sensors, are placed outside of the chamber and are located symmetrically about centerline 352. Similar sets of sensors are provided for the other chambers. Analog-type sensors may be advantageously used.

When shuttle 70 is positioned such that centerline 358 is coincident with centerline 352, then the shuttle 70 will be positioned in the center of the chamber 54A, and the magnet 356 is centered between the sensors 360A and 362A. In this case, the analog voltage output of both sensors will be at the same level.

This system can be used in an error-correction scheme. After a shuttle move is made, the voltages on the sensors can be checked to determine if the voltages are the same. If they are not, feedback to a control system 364 may be used to control a drive mechanism 100. Drive mechanism 100' may then be controlled to move the shuttle 70 until the voltages on the two sensors are equal, thus denoting correct shuttle positioning. This system may be repeated for each drive mechanism and chamber. If desired, the same control system computer may be used to determine the feedback and control to the drive mechanisms. In this way, a distributed feedback error correction scheme may be achieved for the entire modular system.

The use of just one sensor has disadvantages. As shown in FIG. 15, the relative position of the magnet 356 and a sensor, such as sensor 360A, is shown with a corresponding graph of sensor analog output voltage (y-axis) versus position of magnet (x-axis). Line 372 indicates when the magnet 356 is located nearest the sensor 360A. As can be seen in FIG. 15, the signal output when the magnet is centered on the sensor is somewhat flat and smooth from which it is very difficult to discern a defined peak position. An additional disadvantage is that the peak level changes as the magnetic field strength changes with temperature.

FIGS. 16 and 17 show the situation for two sensors, such as 360A and 360B. The output of sensor 360A is shown as curve A, and the output of sensor 360B is shown as curve B. At line 374, where the curves cross, the voltages are equal, indicating the magnet 356 is centered between the sensors. This crossing point 374 is not affected by magnetic field strength changes in the magnet caused by temperature. This provides advantages for the two sensor system.

Limit sensors (LS) may be used as shown in FIG. 11. Limit sensors 308 may be placed near walls, gate valves, or other types of hard stops. These limit sensors sense the location of an end of the shuttle, and reduce or eliminate power to the drive mechanism motor when actuated. For example, the limit sensor 308 is placed a distance "A" from a hard stop location 310, for example, a wall of the chamber. At the point where limit sensor 308 senses shuttle 70, the shuttle 70 is similarly a distance A from the hard stop. The system may be designed so that when the shuttle 70 is a distance A from the hard stop, the opposite end of the shuttle 70 is a distance "B" away from the centerline of the drive mechanism. Then, long as B is greater than A, the shuttle 70 cannot accidentally roll off the drive mechanism or, alternatively, crash into the hard stop 310.

As shown in FIGS. 1 and 1A, alcoves or compartments 148 in the end walls of the entrance and exit load locks are provided to accommodate an associated end of a side rail of the shuttles 70 and 72, respectively. When the shuttle is in the target position in a load lock chamber, the side rail's ends are received and accommodated by such compartments. As noted above, the rails may be generally longer than the length of process chambers 54A–54C. This allows the volume of the load locks to be correspondingly minimized.

For a variety of reasons, it may be advantageous to attempt to minimize chamber volume. Reduced chamber volume facilitates faster and more economical pumping down of chambers, including reducing the capacity requirements for any vacuum pumps. Additionally, the introduction of process or inert gases is facilitated with a reduced consumption of such gases. Heating and cooling may be more easily facilitated. Process uniformity may be increased, for example, by providing a more uniform plasma in the absence of voids or cavities.

With respect to the process of chambers 54A–54C, an additional benefit of providing each chamber with two valves 56A–56C, 58A–58C is that this allows each such valve to be located substantially adjacent the susceptor 130 of the associated chamber. An even more important benefit is that the drive mechanism 100 of each processing chamber may be located in the outside of the cavity defined by the valve housing (see FIG. 3). This significantly reduces contamination of the chambers due to the drive mechanisms.

Advantageously, the system is configured so that certain components may be serviced or replaced with minimal disruption of the system or contamination of the system chambers. The drive motors 102 and encoders 10 may be serviced or replaced from outside the island without risk of contamination. If a drive shaft 104 or any of its associated components needs to be serviced or replaced, such operation may be performed with the valves on either side of the drive mechanism closed. Thus, the interiors of the adjacent chambers will not become contaminated from such action. Any contamination will be limited to the space between the valves immediately surrounding the drive mechanism which may be more readily cleaned than the interior of the adjacent chambers.

A number of embodiments of the present invention have been described. Nevertheless, it will be understood that various modifications may be made without departing from the spirit and scope of the invention. For example, the particular processes associated with fabricating a given device may advantageously be associated with different chamber arrangements and sequences of use. In this way, the types of chambers which may be employed include those used for etching processes, physical vapor deposition, chemical vapor deposition, etc. In another modification, while three process chambers have been described here, the system may employ a single process chamber, two process chambers, or more than three process chambers. The system of the present invention, as it is modular and incremental, allows numerous modifications to suit any particular process. For example, the shuttle of the present invention may be controlled to even repeat processing steps for a particular substrate if desired. In this way, the shuttle may be controlled to be bidirectional. Accordingly, other embodiments are within the scope of the following claims.

What is claimed is:

1. An apparatus for processing a substrate, comprising:
    a first processing chamber;
    a second processing chamber in communication with the first processing chamber;
    a substrate transfer shuttle moveable along a shuttle path between a first position in the first chamber and a second position in the second chamber to transfer a substrate between the first chamber and the second chamber;
    a drive mechanism isolated from the chambers and located between the first and second chambers, the drive mechanism configured to move the substrate transfer shuttle along an associated portion of a shuttle path; and
    a control system configured to control the drive mechanism and to power the drive mechanism to drive the substrate transfer shuttle from at least the first position to the second position.

2. The apparatus of claim 1, wherein the drive mechanism further comprises a pinion gear and a motor.

3. The apparatus of claim 1, further comprising:
    a third chamber in communication with the second chamber; and
    a second substrate transfer shuttle movable along a shuttle path between a third position in the third chamber and the second position in the second chamber for transferring a substrate between the third chamber and the second chamber.

4. The apparatus of claim 3, wherein the drive mechanism includes separate drives for each of the first, second and third chambers configured to move the substrate transfer shuttles along associated portions of the shuttle paths; and wherein the control system controls each drive.

5. The apparatus of claim 1, wherein the second chamber is configured to perform a process on the substrate in a target position within the second chamber.

6. The apparatus of claim 5, wherein the substrate transfer shuttle has mounted thereon an element located at a predetermined location, the element capable of being sensed by a sensor.

7. The apparatus of claim 6, further including a sensor assembly in the second chamber located along the shuttle path and configured to detect when the element is at a predetermined distance from the target position.

8. The apparatus of claim 7, wherein the control system controls movement of the substrate transfer shuttle along the shuttle path and is configured to receive an input from the sensor assembly indicating the position of the substrate transfer shuttle, the sensor assembly output providing a feedback to the control system to correct for errors in positioning of the substrate transfer shuttle.

9. The apparatus of claim 1, wherein the substrate has a leading edge relative to a direction of motion and the second chamber is configured to perform a process on the substrate in a target position within the second chamber.

10. The apparatus of claim 9, further including a lift mechanism cooperating with the substrate transfer shuttle for supporting the substrate at the target position.

11. The apparatus of claim 10, wherein the substrate transfer shuttle carries the substrate at a substrate-carrying location defined on the substrate transfer shuttle, said substrate transfer shuttle having a forward edge spaced a predetermined distance away from the substrate-carrying location and movable along a shuttle path between the first chamber and the second chamber, the substrate transfer shuttle configured and arranged so that when in the target position the substrate may be exchanged between the substrate transfer shuttle and the lift mechanism.

12. The apparatus of claim 11, further including a sensor in the second chamber located along the shuttle path and configured to detect when the forward edge of the substrate transfer shuttle or the leading edge of the substrate reaches an intermediate location separated from the target position by the predetermined distance.

13. The apparatus of claim 12, wherein the control system controls movement of the substrate transfer shuttle along the shuttle path and is configured to receive an input from the sensor indicating that the forward edge of the substrate transfer shuttle or the leading edge of the substrate has reached the intermediate location in terminating movement of the substrate transfer shuttle when the substrate transfer shuttle moves the predetermined distance beyond the intermediate location.

14. An apparatus for processing a substrate, comprising:

a first chamber;

a second chamber in selective communication with the first chamber;

a third chamber in selective communication with the second chamber;

a substrate transfer shuttle moveable along a shuttle path between a first position in the first chamber, a second position in the second chamber, and a third position in the third chamber, to transfer a substrate between the chambers;

a first drive mechanism configured to move the substrate transfer shuttle along at least a portion of the shuttle path between the first and second chambers;

a second drive mechanism configured to move the substrate transfer shuttle along at least a portion of the shuttle path between the second and third chambers;

a control system to control the first and second drive mechanisms and configured to:

drive the substrate transfer shuttle from the first position toward the third position through an intermediate position wherein the substrate transfer shuttle at least partially engages the second drive mechanism; and receive an input indicative of the substrate transfer shuttle having a passed through the intermediate position, whereby transfer of the substrate transfer shuttle is synchronized between the first drive mechanism and the second drive mechanism.

15. The apparatus of claim 14, wherein the control system is further configured to, upon powering of the first drive mechanism, power the second drive mechanism.

16. The apparatus of claim 15, wherein the control system is further configured to:

upon receiving said input, reduce power to the first drive mechanism.

17. The apparatus of claim 14, wherein the control system is further configured to, after powering of the first drive mechanism, and before contact between the shuttle and the second drive mechanism, power the drive mechanism for the second chamber.

18. The apparatus of claim 14, wherein the control system is further configured to, upon receiving said input, power the second drive mechanism.

19. The apparatus of claim 14, wherein the control system includes an encoder coupled to a motor to determine an amount of movement caused by the motor.

20. The apparatus of claim 14, wherein the first and second drive mechanisms further include pinion gears and said substrate transfer shuttle further includes a toothed rack, wherein said pinion gears are meshable with said toothed rack.

21. A method for processing a substrate, comprising:

moving a substrate transfer shuttle along a shuttle path between a first position in a first chamber and through a second position in a second chamber and to a third position in a third chamber to transfer a substrate between the first chamber and the third chamber;

controlling a drive mechanism for each of the first, second, and third chambers to move the substrate transfer shuttle along associated portions of the shuttle path, wherein said controlling includes:

powering the drive mechanism for the first chamber to drive the substrate transfer shuttle from the first position toward the third position and through an intermediate position wherein the substrate transfer shuttle begins to engage and be driven by the drive mechanism for the second chamber;

receiving an input indicative of the substrate transfer shuttle having passed through the intermediate position;

powering the drive mechanism for the second chamber to drive the substrate transfer shuttle from the intermediate position toward the third position.

22. The method of claim 21, wherein said controlling further includes, upon powering of the drive mechanism for the first chamber, powering the drive mechanism for the second chamber.

23. The method of claim 21, wherein said controlling further includes, after powering of the drive mechanism for the first chamber, and before contact of the shuttle and the drive mechanism for the second chamber, powering the drive mechanism for the second chamber.

24. An apparatus for processing a substrate, comprising:

a first chamber;

a second chamber in communication with the first chamber;

a substrate transfer shuttle moveable along a shuttle path between a first position in the first chamber and a second position in the second chamber to transfer a substrate between the first chamber and the second chamber;

a drive mechanism between the first and second chambers configured to move the substrate transfer shuttle along an associated portion of a shuttle path, the drive mechanism including:

powered drive members isolated from the chambers; and non-powered members substantially isolated from processes carried out within the chambers; and a control system to control the drive mechanism and configured to power the drive mechanism to drive the substrate transfer shuttle from the first position to the second position.

25. The apparatus of claim 24, wherein the first chamber is a load lock and the second chamber is a processing chamber.

26. The apparatus of claim 24, wherein the drive mechanism further comprises a pinion gear and a motor.

27. An apparatus for processing a substrate, comprising:

a load lock chamber;

a processing chamber in communication with the load lock chamber;

a substrate transfer shuttle moveable along a shuttle path between a first position in the load lock chamber and a second position in the processing chamber to transfer a substrate between the load lock chamber and the processing chamber;

a drive mechanism isolated from the chambers and located between the load lock chamber and processing chamber, the drive mechanism configured to move the substrate transfer shuttle along an associated portion of a shuttle path; and a control system configured to control the drive mechanism and to power the drive mechanism to drive the substrate transfer shuttle from at least the first position to the second position.

* * * * *

UNITED STATES PATENT AND TRADEMARK OFFICE
CERTIFICATE OF CORRECTION

PATENT NO.   : 6,213,704 B1
DATED        : April 10, 2001
INVENTOR(S)  : White et al.

It is certified that error appears in the above-identified patent and that said Letters Patent is hereby corrected as shown below:

Column 1,
Line 15, please replace "09/082,415" with -- 09/082,413 --.
Line 20, please replace "08/082,488" with -- 09/082,488 --.

Column 4,
Line 55, please replace "11" with -- 10A --.

Column 8,
Line 56, please replace "(0.221)" with -- (0.22$\ell$) --.

Column 9,
Line 65, please replace "100'41" with -- 100'" --.

Column 10,
Line 5, please replace "drive" with -- drives --.

Column 15,
Line 24, please replace "100'41" with -- 100'" --.
Line 36, please replace "1 10" with --110 --.

Column 16,
Line 65, please replace "is" with -- in --.

Column 17,
Line 67, please replace "powerdowns" with -- power-downs --.

Column 18,
Line 48, please replace "Fig. 10" with -- Fig. 10A --.

UNITED STATES PATENT AND TRADEMARK OFFICE
CERTIFICATE OF CORRECTION

PATENT NO.   : 6.213,704 B1
DATED        : April 10, 2001
INVENTOR(S)  : White et al.

It is certified that error appears in the above-identified patent and that said Letters Patent is hereby corrected as shown below:

<u>Column 20,</u>
Line 51, please replace "long" with -- as long --.

Signed and Sealed this

Thirteenth Day of August, 2002

Attest:

JAMES E. ROGAN
Attesting Officer    Director of the United States Patent and Trademark Office